United States Patent
Nambu

(10) Patent No.: US 7,704,877 B2
(45) Date of Patent: Apr. 27, 2010

(54) METHOD OF MANUFACTURING SEMICONDUCTOR DEVICE AND CONTROL SYSTEM

(75) Inventor: Hidetaka Nambu, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 229 days.

(21) Appl. No.: 12/073,235

(22) Filed: Mar. 3, 2008

(65) Prior Publication Data

US 2008/0227224 A1 Sep. 18, 2008

(30) Foreign Application Priority Data

Mar. 16, 2007 (JP) ............... 2007-068584

(51) Int. Cl.
*H01L 21/4763* (2006.01)
(52) U.S. Cl. ............... 438/638; 438/622; 438/637; 438/673; 438/700
(58) Field of Classification Search ......... 438/612–624, 438/637–638, 672–673, 700
See application file for complete search history.

(56) References Cited

U.S. PATENT DOCUMENTS

2006/0019491 A1* 1/2006 Soda ............... 438/638

2007/0082481 A1* 4/2007 Jung ............... 438/629
2008/0171442 A1* 7/2008 Wu et al. ............... 438/702

FOREIGN PATENT DOCUMENTS

| JP | 7-183194 | 7/1995 |
|---|---|---|
| JP | 9-82691 | 3/1997 |
| JP | 9-326382 | 12/1997 |
| JP | 2004-311972 | 11/2004 |
| JP | 2006-32908 | 2/2006 |

* cited by examiner

*Primary Examiner*—Dung A. Le
(74) *Attorney, Agent, or Firm*—McGinn IP Law Group, PLLC

(57) ABSTRACT

When a multi-layer structure is formed by forming the interconnect trenches or via holes having different patterns in a plurality of insulating films, an anti-reflective film and an upper resist film are stacked in this order over an insulating interlayer, and the anti-reflective film is etched through the upper resist film used as a mask, wherein the anti-reflective film is etched while varying a value of at least one etching condition correlative to $\Delta(L_2-L_1)$, expressing dimensional shift of width $L_2$ of opening of the recess formed in the insulating film, with respect to width $L_1$ of opening of the upper resist film, so as to reduce the dimensional shift $\Delta(L_2-L_1)$ as the aperture ratio of the opening to be formed in the upper resist film increases, depending on the aperture ratio.

12 Claims, 19 Drawing Sheets

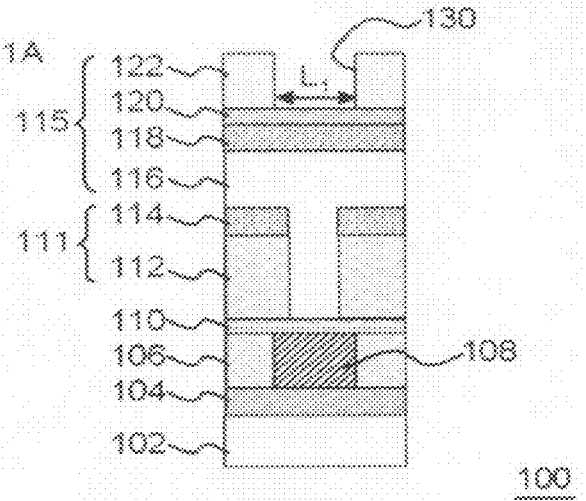
FIG. 1A
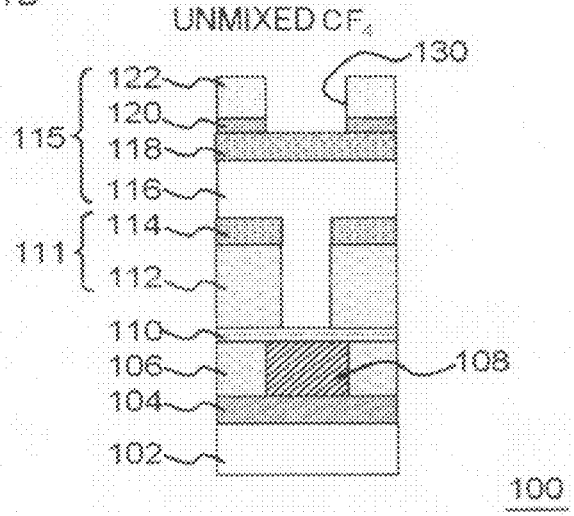
FIG. 1B  UNMIXED CF₄
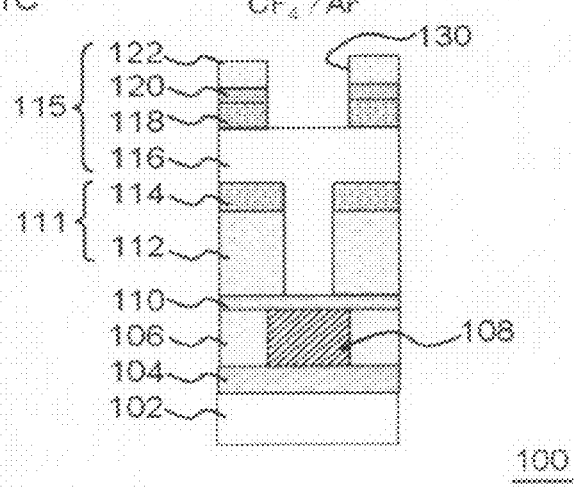
FIG. 1C  CF₄/Ar

FIG. 8A
| APERTURE RATIO (%) | CF$_4$ FLOW RATE (sccm) |
|---|---|
| 20 | 125 |
| 27 | 113 |
| 35 | 100 |
| 43 | 87 |
| 50 | 75 |
FIG. 8B
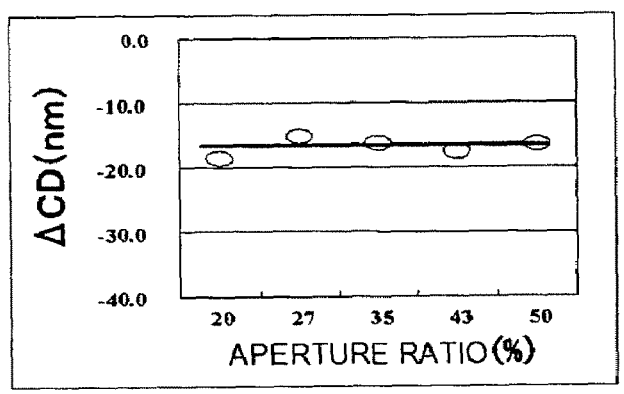
FIG. 8C
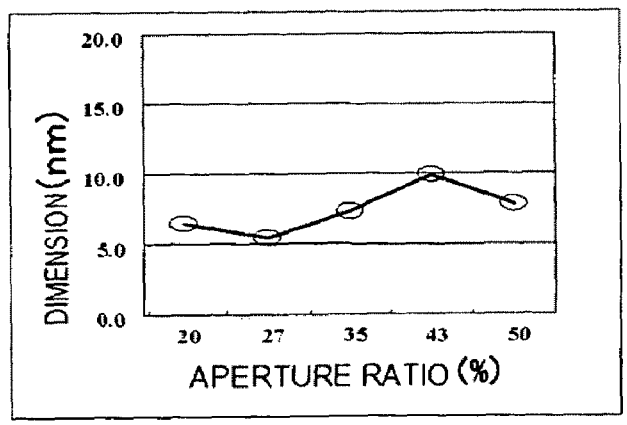

FIG. 15

| APERTURE RATIO (%) | CONDITIONS |
|---|---|
| 20 OR MORE AND LESS THAN 28 | CONDITION A ($CF_4$ FLOW RATE 125sccm) |
| 28 OR MORE AND LESS THAN 43 | CONDITION B ($CF_4$ FLOW RATE 100sccm) |
| 43 OR MORE AND 50 OR LESS | CONDITION C ($CF_4$ FLOW RATE 75sccm) |

UNMIXED CF$_4$

METHOD OF MANUFACTURING SEMICONDUCTOR DEVICE AND CONTROL SYSTEM

This application is based on Japanese patent application No. 2007-068584 the content of which is incorporated hereinto by reference.

BACKGROUND

1. Technical Field

The present invention relates to a method of manufacturing a semiconductor device, and a control system.

2. Related Art

In recent semiconductor elements, delay in signal transmission in interconnects determines operation speed of elements. Delay constant of signal transmission in interconnects is expressed by a product of resistivity of interconnects and capacitance between the adjacent interconnects. Therefore, in view of increasing the operation speed of elements, there are growing trends of using low-dielectric-constant materials having dielectric constants smaller than that of conventional silicon oxide ($SiO_2$) film as an insulating interlayer, and of using copper (Cu) having small resistivity as the interconnects.

Multi-layer interconnects using copper as an interconnect material are formed by the damascene process. In the damascene process, recesses such as interconnect trenches and via holes are formed in an insulating interlayer by etching through a resist film having a predetermined pattern formed therein, a barrier metal film is deposited in the recesses, the recesses are filled with a copper film, and portions of the copper film and the barrier metal film extended outside the recesses are removed by chemical mechanical polishing (CMP), to thereby form copper interconnects or copper vias.

In the damascene process, any interconnects designed under the same dimension should have the same resistivity on a semiconductor substrate, in view of controlling operation timing and operation voltage of transistors exactly as they are designed. It is therefore necessary to form the interconnects and the vias exactly as they are designed. Because the interconnects and the vias in the damascene process are formed by filling the recesses with the copper film as described in the above, it is necessary to form the recesses with uniform sectional area for desirable dimensional control. In other words, precise control of width and depth of the recesses is required.

However in multi-layer structure, the individual layers have different aperture ratios of pattern (ratio of areas of interconnects and vias to the total area of a layer, also referred to as data ratio). For example, the upper layer having a large ratio of source interconnects which handle large current tends to have a larger aperture ratio than the lower layer has. Taking difference by product into consideration, the aperture ratio of pattern on the substrate may vary approximately from 20 to 80%.

There has been a problem in that difference in the aperture ratio of pattern resulted in varied width of obtainable recesses, even if mask patterns having the same pattern width was used. In order to form the interconnect patterns exactly as they are designed in the multi-layer structure, it is therefore necessary to establish a manufacturing process not susceptible to dimensional fluctuation even under different aperture ratios of pattern.

There have been known conventional techniques of correcting dimensional changes corresponding to the aperture ratio of the individual layers to be etched.

Japanese Laid-Open Patent Publication No. H9-82691 describes a technique of shortening retention time of an etching gas when the aperture ratio of a layer to be etched is large or when an etching mask has a reversely-tapered profile, and elongating the retention time of the etching gas in the reverse situation. The technique is reportedly successful in reducing critical dimension loss dependent to the aperture ratio of the layer to be etched and taper angle of the etching mask.

Japanese Laid-Open Patent Publication No. H9-326382 describes a technique of carrying out etching after determining etching parameters depending on the area of opening in which the etching proceeds. The document describes a technique of etching a bulk portion of aluminum alloy, while reducing flow rate of chlorine as the area to be etched increases.

Japanese Laid-Open Patent Publication No. 2004-311972 describes etching capable of suppressing the dimensional shift and of obtaining a desired etching profile, irrespective of pattern to be formed, by allowing etching to proceed while using a focus ring having a surface area corresponded to the aperture ratio of pattern of an object to be etched, so as to control amount of fluorine radical to be scavenged.

By the way, with advancement of shrinkage of semiconductor devices, fine processing has been becoming more necessary also for etching technique using photoresist. Three-layer resist process has been known as a method of fine processing. In the three-layer resist process, first, a thick lower resist is coated over a layer on the substrate as a target of fine processing. Next, an intermediate film is formed over the lower resist layer. Further thereon, an upper resist layer, typically a resist film adapted to ArF lithography, is formed by coating, the upper resist layer is subjected to lithographic exposure and development, to thereby form a mask used for processing. If any misalignment should occur, only the upper resist layer is removed by $O_2$ ashing or by stripping using an organic solvent, the upper resist layer is formed again, and subjected to lithographic exposure and development. Japanese Laid-Open Patent Publication No. H7-183194 describes a technique of forming an intermediate film of three-layered resists by high density plasma CVD, aiming at improving critical dimension loss and pattern profile in the process of etching the lower resist layer. As the intermediate film herein, a $SiO_2$ film formed by low-temperature CVD is adopted.

Japanese Laid-Open Patent Publication No. 2006-32908 describes a technique of etching an organic anti-reflective film through a mask layer composed of ArF resist, in which dimension of an opening formed in an anti-reflective film is controlled by varying radio-frequency power applied for raising plasma. The technique is reportedly successful in making dimension of opening of the organic anti-reflective film smaller than dimension of opening pattern of the mask layer before the etching. It is also described that, in such etching of the organic anti-reflective film, changes in the applied radio-frequency power applied for raising plasma may result in CD shift, which is defined as an amount of shift of diameter of opening measured at the bottom of the anti-reflective film (bottom CD) to diameter of opening measured at the top of the mask layer (top CD) in the center portion of a wafer.

However, the technique described in Japanese Laid-Open Patent Publication No. 2004-311972 needs recovery of atmospheric pressure of a process chamber of a vacuum apparatus for detachment and attachment of the focus ring, every time layers of different aperture ratios are processed. It takes a long time to achieve a steady vacuum state of the chamber again from the atmospheric pressure, and this means increase in so-called down time and serious degradation of operational efficiency of the apparatus.

The techniques described in Japanese Laid-Open Patent Publication Nos. H9-82691 and H9-326382 correct dimensional shift corresponded to the aperture ratios of layers to be etched, by varying etching conditions under which the layers to be processed contained in the final products (for example, a refractory metal-containing polycide layer in Japanese Laid-Open Patent Publication No. H9-82691, and a $SiO_2$ film in Japanese Laid-Open Patent Publication No. H9-326382) are etched. However, the present inventors found out from their investigations that, in the process of forming the interconnect trench by the damascene process, it was difficult to correct the dimensional shift under a good controllability, even with every effort of correcting the dimensional shift corresponded to the aperture ratio of pattern, by controlling etching conditions under which the insulating interlayer, as a target for forming the interconnect trench, is etched.

Japanese Laid-Open Patent Publication No. 2006-32908 describes control of the dimension of opening of the anti-reflective film, which resides only in the process of manufacturing but not remains in the final product, but what is important is a dimension of a material contained in the final product, in view of ensuring good electrical characteristics of the final product. The dimension of the material contained in the final product cannot always be controlled to a desired value, even if the dimension of opening of the anti-reflective film might be controlled to a predetermined value. As described later referring to FIG. 19, the dimensional control of the insulating interlayer to be processed, contained in the final product, resulted in failure, even if radio-frequency power (top power) to be applied was varied.

SUMMARY

In one embodiment, there is provided a method of manufacturing a semiconductor device including:

forming a recess, which serves as an interconnect trench or a via hole, in an insulating film to be processed formed over a semiconductor substrate by stacking an anti-reflective film and an upper resist film in this order over the insulating film to be processed, and forming an opening in the upper resist film by lithographic exposure through a mask having a predetermined pattern and development, etching the anti-reflective film through the upper resist film used as a mask, using a first etching gas containing a fluorine-base gas, and transferring a pattern formed in the anti-reflective film to the insulating film to be processed; and repeating the forming the recess to a plurality of the insulating films, so as to form recesses of different patterns respectively to the plurality of the insulating films, to thereby form a multi-layer structure;

wherein in the etching the anti-reflective film in each of the forming the recess, a value of one etching condition correlative to a dimensional shift $\Delta(L_2-L_1)$, where $L_1$ is a width of the opening in the upper resist film obtained in the forming the opening in the upper resist film and $L_2$ is a width of a recess formed in the insulating film in the transferring the pattern, is varied with respect to the aperture ratio of an opening formed in the upper resist film so as to reduce the dimensional shift $\Delta(L_2-L_1)$ as the aperture ratio of the opening increases.

By virtue of this configuration, in such the forming a recess, the value of the one etching condition may be varied depending on the aperture ratio of the opening formed in the upper resist film, so as to reduce the dimensional shift $\Delta(L_2-L_1)$ as the aperture ratio increases, and so as to make the dimensional shift $\Delta(L_2-L_1)$ fall within a predetermined range, even if the plurality of the insulating films have different aperture ratios.

The present inventors found out that the dimensional fluctuation corresponded to the aperture ratio was extremely large, when the upper resist film was composed of a material less durable against impact such as bombardment of ions, such as a resist film adapted to ArF lithography, because etching through such the upper resist film used as a mask should be proceeded under conditions ensuring low ionicity (large pressure in the chamber, small top power, and small bias power). The present inventors also found from their extensive investigations that such dimensional shift was more likely to occur when an insulating film such as a $SiO_2$ film is etched. For example, for the case where a single layer of upper resist film is formed over an insulating film to be processed to form a recess therein, and the insulating film to be processed is etched through the upper resist film used as a mask, the dimensional fluctuation corresponded to the aperture ratio tends to occur in the insulating film. Alternatively, as described later, for the case where the etching is proceeded while forming a multi-layer resist film composed of a lower resist film, an intermediate insulating film and an upper resist film over the insulating film to be processed to form a recess therein, the dimensional fluctuation corresponded to the aperture ratio is likely to occur in the intermediate insulating film, when the intermediate insulating film is etched through the upper resist film used as a mask.

The present inventors found out that the dimensional fluctuation may be suppressed even if the aperture ratio of patterns are different, by making reverse correction assuming the dimensional shift expected in etching of the insulating film which is highly susceptible to the dimensional fluctuation, before the insulating film is etched, rather than during the etching of the insulating film (including the intermediate insulating film). This sort of reverse correction may be effected by controlling value of the one etching condition correlative to the dimensional shift, based on the dimensional shift $\Delta(L_2-L_1)$, expressing width $L_2$ of opening of a recess formed in the insulating film, which will be contained in the final product, with respect to width $L_1$ of opening of the upper resist film obtained by lithographic exposure and development of the upper resist film in such forming an opening in the upper resist film. According to the method, the dimensional fluctuation of the insulating film to be processed, which will be contained in the final product, may precisely be corrected.

As described later referring to FIG. 4, under a constant etching condition, a larger aperture ratio results in a larger dimensional shift $\Delta(L_2-L_1)$. Accordingly, the dimensional fluctuation may be suppressed even under different aperture ratios of pattern, by etching the anti-reflective film based on an etching condition under which the dimensional shift $\Delta(L_2-L_1)$ decreases as the aperture ratio increases, depending on the aperture ratio.

Based on the findings described in the above, the present inventors found out that flow rate of one constituent gas contained in the first etching gas, temperature of a stage on which the semiconductor substrate is placed, pressure in a chamber in which the etching proceeds, and bias power, among all etching conditions of the anti-reflective film, are in correlation with the dimensional shift $\Delta(L_2-L_1)$. In particular for the case where $CF_4$ gas was used as the first etching gas, the flow rate of $CF_4$ gas was found to be in a good correlation with the dimensional shift $\Delta(L_2-L_1)$. Accordingly, etching of the anti-reflective film, in such a manner that the flow rate of $CF_4$ decreases as the aperture ratio increases, may prevent dimensional shift after processing, even if the aperture ratio of pattern varies.

In the method of manufacturing a semiconductor device of the embodiment, in such the forming the opening in the upper resist film, before stacking the anti-reflective film and the upper resist film over the insulating film, a lower resist film and an intermediate insulating film are stacked in this order over the insulating film, and the anti-reflective film and the upper resist film are stacked over the intermediate insulating film, and the transferring the pattern formed in the anti-reflective film to the insulating film to be processed further includes:

etching the intermediate insulating film through the upper resist film and the anti-reflective film used as a mask;

etching the lower resist film through the intermediate insulating film used as a mask; and etching the insulating film to be processed through the lower resist film used as a mask. The intermediate insulating film herein may be a $SiO_2$ film.

From investigations by the present inventors, it was revealed that, for the case where the multi-layer resist film composed of the lower resist film, the intermediate insulating film and the upper resist film is used in this way, the dimensional fluctuation corresponded to the aperture ratio became extremely large when the intermediate insulating film is etched through the upper resist film used as a mask. Because the upper resist film is composed of a material less durable against impact such as bombardment of ions, such as a resist film adapted to ArF lithography, etching through such upper resist film used as a mask should be proceeded under conditions ensuring low ionicity. As described in the above, an extremely large dimensional fluctuation occurs in this stage. On the other hand, in the process of etching of the insulating interlayer using the lower resist layer as a mask, the etching may be proceeded under highly ionic conditions (small pressure in the chamber, large top power, and large bias power), so that the dimensional fluctuation corresponded to the aperture ratio hardly occurs. Therefore, by making reverse correction assuming the amount of dimensional fluctuation expected in etching of the intermediate insulating film, before the intermediate insulating film is etched through the upper resist film used as a mask, the dimensional fluctuation of the intermediate insulating film may be suppressed, and such suppressed state of dimensional fluctuation may be kept unchanged also in the processes thereafter.

In another embodiment, there is provided a control system controlling procedures of manufacturing a semiconductor device, the procedures including:

forming a recess, which serves as an interconnect trench or a via hole, in an insulating film to be processed formed over a semiconductor substrate by stacking an anti-reflective film and an upper resist film in this order over the insulating film to be processed, and forming an opening in the upper resist film by lithographic exposure through a mask having a predetermined pattern and development, etching the anti-reflective film through the upper resist film used as a mask, using a first etching gas containing a fluorine-base gas, and transferring a pattern formed in the anti-reflective film to the insulating film to be processed; and repeating the forming the recess to a plurality of the insulating films, so as to form recesses of different patterns respectively to the plurality of the insulating films, to thereby form a multi-layer structure;

the system including:

a memory unit which stores a table storing the values of one etching condition in the etching the anti-reflective film correlative to a dimensional shift $\Delta(L_2-L_1)$, where $L_1$ is a width of the opening in the upper resist film obtained in the forming the opening in the upper resist film and $L_2$ is a width of a recess formed in the insulating film in the transferring the pattern, and the aperture ratios of the opening formed in the upper resist film, as being correlated so that the dimensional shift $\Delta(L_2-L_1)$ decreases as the aperture ratio increases;

an aperture ratio data acquisition unit which acquires the aperture ratio, for each of the plurality of insulating films in the multi-layer structure; and a condition decision unit which determines the value of the one etching condition correlated to the aperture ratio, based on the aperture ratio acquired by the aperture ratio data acquisition unit, referring to the correlation table in the memory unit, for each of the plurality of insulating films in the multi-layer structure.

By virtue of this configuration, the dimensional shift after processing may hardly change, even if the aperture ratio of pattern varies.

It is to be understood that any arbitrary combinations of the above-described constituents, and any exchanges of expression of the present invention among method, apparatus, system, recording medium, computer program and so forth may be effective as embodiments of the present invention.

According to the present invention, in the process of forming a multi-layer structure by forming interconnect trenches or via holes of different patterns in a plurality of insulating films, width of interconnects or width of vias may be made uniform, irrespective of difference in the patterns.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 1A to 3C are sectional views showing procedures of manufacturing a semiconductor device in one embodiment of the present invention;

FIGS. 8A to 8C are drawings showing the dimensional shift $\Delta CD$ ($L_2-L_1$) and dimension at the bottom, observed when the flow rate of $CF_4$ gas in the process of etching the anti-reflective film was varied depending on the aperture ratio;

FIG. 15 is a drawing showing a table containing aperture ratio, and etching conditions correlated to the aperture ratio;

DETAILED DESCRIPTION

Figure 2A:
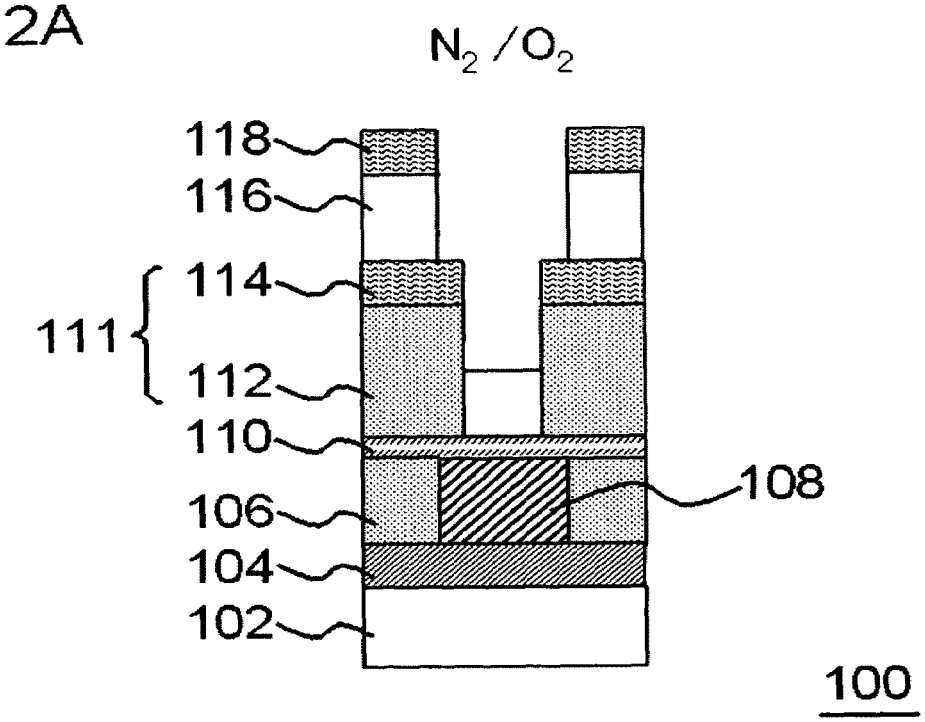

The invention will now be described herein with reference to an illustrative embodiments. Those skilled in the art will recognize that many alternative embodiments can be accomplished using the teachings of the present invention and that the invention is not limited to the embodiment illustrated for explanatory purposes.

Paragraphs below will describe embodiments of the present invention, referring to the attached drawings. In all drawings, any similar constituents will be given with similar reference numerals, and explanation therefor will not be repeated.

FIG. 1A to FIG. 3C are sectional views showing procedures of manufacturing a semiconductor device in this embodiment.

A semiconductor device 100 contains a semiconductor substrate 102, and a multi-layer structure having an insulating film 104, a first insulating interlayer 106, an etching stopper film 110, and a second insulating interlayer 111 stacked in this order over the semiconductor substrate 102. The second insulating interlayer 111 contains a low-k film 112 typically composed of a SiOC film, and a protective insulating film 114 typically composed of a $SiO_2$ film. The first insulating interlayer 106 has a lower interconnect 108 formed therein. Although not shown in the drawing, the semiconductor substrate 102 has elements such as transistors on the surface, or in the surficial portion thereof. The semiconductor substrate 102 may be a silicon substrate for example. The individual layers expressed in the drawings are not always necessarily be a single layer, but may have a multi-layered structure.

Next, in this structure, a damascene interconnect structure connected to the lower interconnect 108 is formed in the second insulating interlayer 111. First, a via hole is formed in the second insulating interlayer 111, while leaving the etching stopper film 110 unremoved on the lower interconnect 108.

Thereafter, a resist film used for forming an interconnect trench is formed over the second insulating interlayer 111. In this embodiment, a multi-layer resist film 115 composed of a lower resist film 116, an intermediate insulating film 118, and an upper resist film 122 is used. The multi-layer resist film 115 further contains an anti-reflective film 120 formed between the intermediate insulating film 118 and the upper resist film 122.

The upper resist film 122 may be a resist film used in lithography using ArF excimer laser as a light source. The upper resist film 122 may be configured using a material similar to that generally used in the multi-layer resist film typically based on the three-layer resist process, and may be a chemical-amplification-type resist film. The lower resist film 116 may be configured using a material more resistant against impact typically ascribable to ion bombardment than the upper resist film 122. The lower resist film 116 may typically be a resist film for i-line lithography. The lower resist film 116 may be configured using a material similar to that used for the lower resist film generally adopted to the multi-layer resist film typically based on the three-layer resist process, and may typically be configured by Novorac-type positive resist, polyimide resin, heat-curable phenol and so forth. The intermediate insulating film 118 may be a $SiO_2$ film, for example. The anti-reflective film 120 may be configured typically by an aromatic polyester-base material.

The upper resist film 122 is formed over the anti-reflective film 120, the upper resist film 122 is then exposed to ArF excimer laser light through a mask, to thereby form, in the upper resist film 122, an opening 130 used for forming an interconnect trench. FIG. 1A is a drawing showing a state in this stage.

Next, the anti-reflective film 120 is etched through the upper resist film 122 used as a mask (FIG. 1B). A gas (first etching gas) used for etching the anti-reflective film 120 may contain a fluorine-containing gas. The resist film adapted to ArF lithography is less durable against impact typically caused by ion bombardment, so that it is desirable to select the gas used for etching the anti-reflective film 120 capable of protecting the resist with a depositional matter produced by dissociation of the gas during the etching, and showing a small sputtering, or resist-bombarding effect. As this sort of etching gas for the anti-reflective film 120 in this embodiment, unmixed $CF_4$ gas containing substantially $CF_4$ gas only may be adoptable. The expression of "containing substantially $CF_4$ gas only" herein means that concentration of gases other than $CF_4$ gas is not higher than a level not influential to the etching characteristics. By using the unmixed $CF_4$ gas, the upper resist film 122 may be protected, and also the anti-reflective film 120 may be protected so as to suppress increase in the roughness of the anti-reflective film 120. Etching through the resist film adapted to ArF lithography needs to be proceeded under conditions of low ionicity. For example, top power may be adjusted to 1000 W or lower. By the adjustment, increase in the roughness of the resist film adapted to ArF lithography may be suppressed, and profile obtained after etching may be kept desirable.

Next, the intermediate insulating film 118 is etched through the upper resist film 122 and the anti-reflective film 120 used as a mask (FIG. 1C). Etching gas used herein may be a $CF_4$/Ar mixed gas.

Thereafter, the lower resist film 116 is etched through the upper resist film 122, the anti-reflective film 120, and the intermediate insulating film 118 used as a mask (FIG. 2A). An etching gas used herein may be a $N_2/O_2$ mixed gas. In the process of etching the lower resist film 116, also the upper resist film 122 and the anti-reflective film 120 may be etched. Even in this case, the intermediate insulating film 118 can function as a mask, so that the pattern in the upper layers may be transferred to the lower resist film 116 in an exact manner.

Figure 2B:
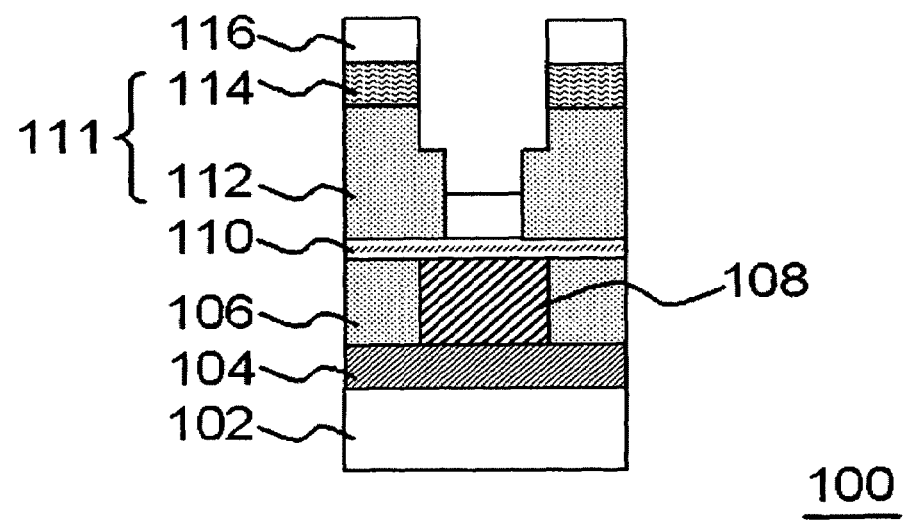

Next, the protective insulating film 114 and the low-k film 112 are sequentially etched through the intermediate insulating film 118 and the lower resist film 116 used as a mask (FIG. 2B). Because the lower resist film 116 herein is composed of a material stronger against impact ascribable to ion bombardment than the upper resist film 122, so that the etching may be proceeded under conditions of larger ionicity than in the conditions under which the anti-reflective film 120, the intermediate insulating film 118 and so forth are etched. An etching gas etching the protective insulating film 114 and the low-k film 112 herein may be a $CF_4/CHF_3/Ar/O_2$ mixed gas. Although the intermediate insulating film 118 may be etched in the process of etching the protective insulating film 114 and the low-k film 112, the pattern in the upper layers may be transferred to the protective insulating film 114 and the low-k film 112 in an exact manner, because the lower resist film 116 can function as a mask.

Figure 3A:
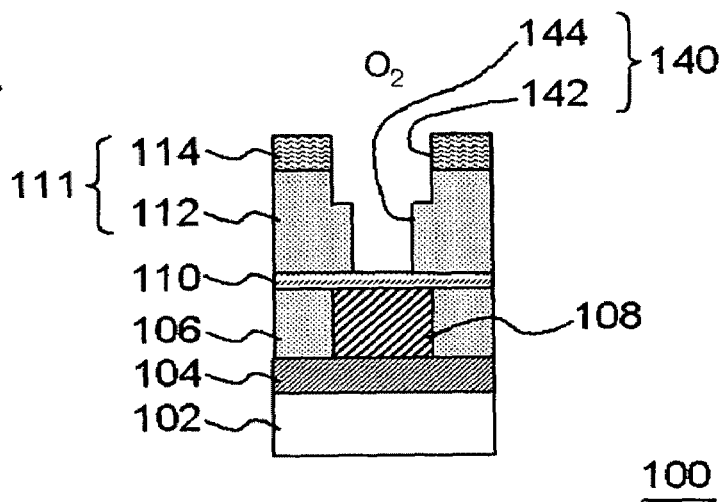
Figure 3B:
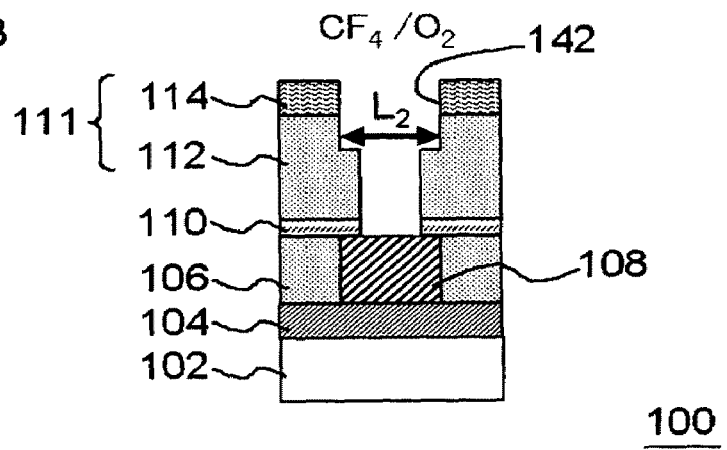
Figure 3C:
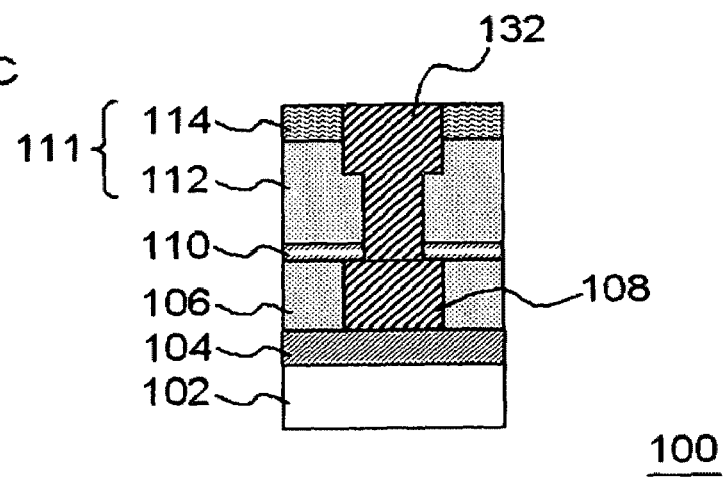

Next, the lower resist film 116 is removed by $O_2$ ashing (FIG. 3A). Thereafter, the etching stopper film 110 is removed typically by using a $CF_4/O_2$ mixed gas as an etching gas, to thereby allow the surface of the lower interconnect 108 to expose (FIG. 3B). By this process, a dual damascene trench 140 (an interconnect trench 142 and a via hole 144) connected to the lower interconnect 108 are formed. Next, the dual damascene trench 140 is filled with an interconnect material, and a portion of the interconnect material swelled out from the dual damascene trench 140 is removed by CMP, to thereby form an upper interconnect 132 (FIG. 3C).

As described in the above, there has been a conventional problem in the process of transferring the pattern of the upper resist film 122 to the second insulating interlayer 111, in that the dimensional shift $\Delta CD$ ($L_2-L_1$) at the bottom (dimensional shift $\Delta(L_2-L_1)$) between the bottom width $L_1$ (width $L_1$) of the opening 130 (see FIG. 1A) and the bottom width $L_2$ (width $L_2$) of the interconnect trench 142 (see FIG. 3B) varies depending on the ratio of area occupied by the opening 130 to the total area of the upper resist film 122 (referred to as "aperture ratio", hereinafter) under a constant etching condition. The aperture ratio may be determined based on the design data of the opening as will be explain later with referring to EB conversion. As has been mentioned in the above, the present inventors found out that, by controlling etching conditions in the step of etching the anti-reflective film, reverse correction is made assuming the dimensional shift expected thereafter in etching of the intermediate insulating film 118, and thereby fluctuation in the final dimensional shift $\Delta CD$ ($L_2-L_1$) at the bottom may be suppressed. More specifically, the present inventors found out that fluctuation in the dimensional shift $\Delta CD$ ($L_2-L_1$) at the bottom may be suppressed by etching the anti-reflective film while varying value of one etching condition correlative to $\Delta(L_2-L_1)$, out of all etching conditions relevant to the etching of the anti-reflective film, so as to reduce the dimensional shift $\Delta(L_2-L_1)$ as the aperture ratio increases depending on the aperture ratio.

In particular, the present inventors found out that, when the anti-reflective film 120 is etched using an unmixed $CF_4$ gas, flow rate of the etching gas (unmixed $CF_4$ gas) shows a good correlation with the dimensional shift $\Delta CD$ ($L_2-L_1$) at the bottom, and that, when interconnect trenches or via holes having different patterns are formed in a plurality of insulating films to thereby form a multi-layer structure, width of interconnect and via holes may be equalized irrespective of difference in the pattern, by controlling the flow rate of the etching gas. Specific examples will be explained below.

Figure 4:
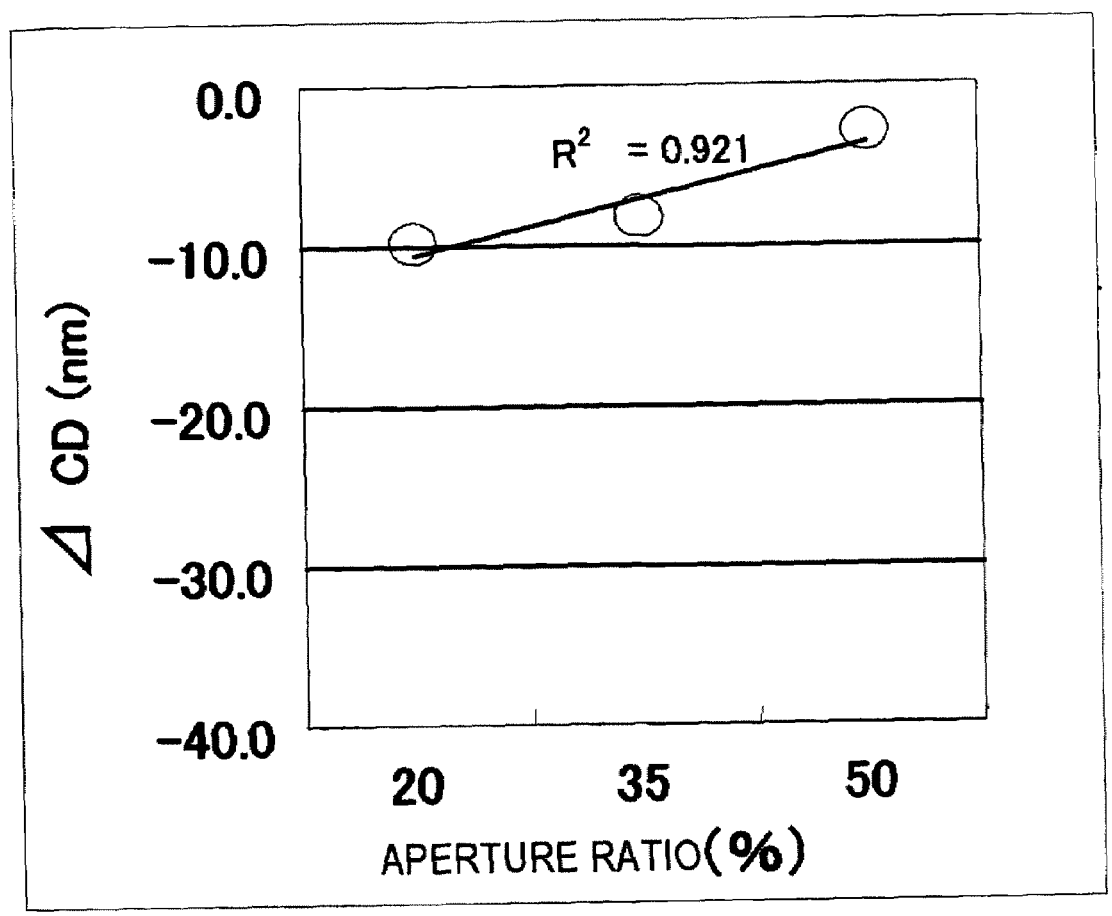
FIG. 4 is a drawing showing dimensional shift $\Delta CD$ ($L_2-L_1$) at the bottom of trenches under varied aperture ratio, observed in the procedure of forming dual damascene trenches in a second insulating interlayer explained referring to FIGS. 1A to 3C under a constant etching condition.

FIG. 4 is a drawing showing dimensional shift $\Delta CD$ ($L_2-L_1$) at the bottom in relation to varied aperture ratio, in procedures of forming the dual damascene trench 140 in the second insulating interlayer 111, as explained referring to FIG. 1A to FIG. 3C. The etching conditions herein were set identical for all cases.

As shown in FIG. 4, dimensional shift $\Delta CD$ ($L_2-L_1$) at the bottom shifts to the plus side as the aperture ratio becomes larger. Since the bottom width $L_1$ of the opening 130 is kept nearly constant, it may be understood that the bottom width $L_2$ of the interconnect trench 142 increases as the aperture ratio becomes larger.

Figure 5:
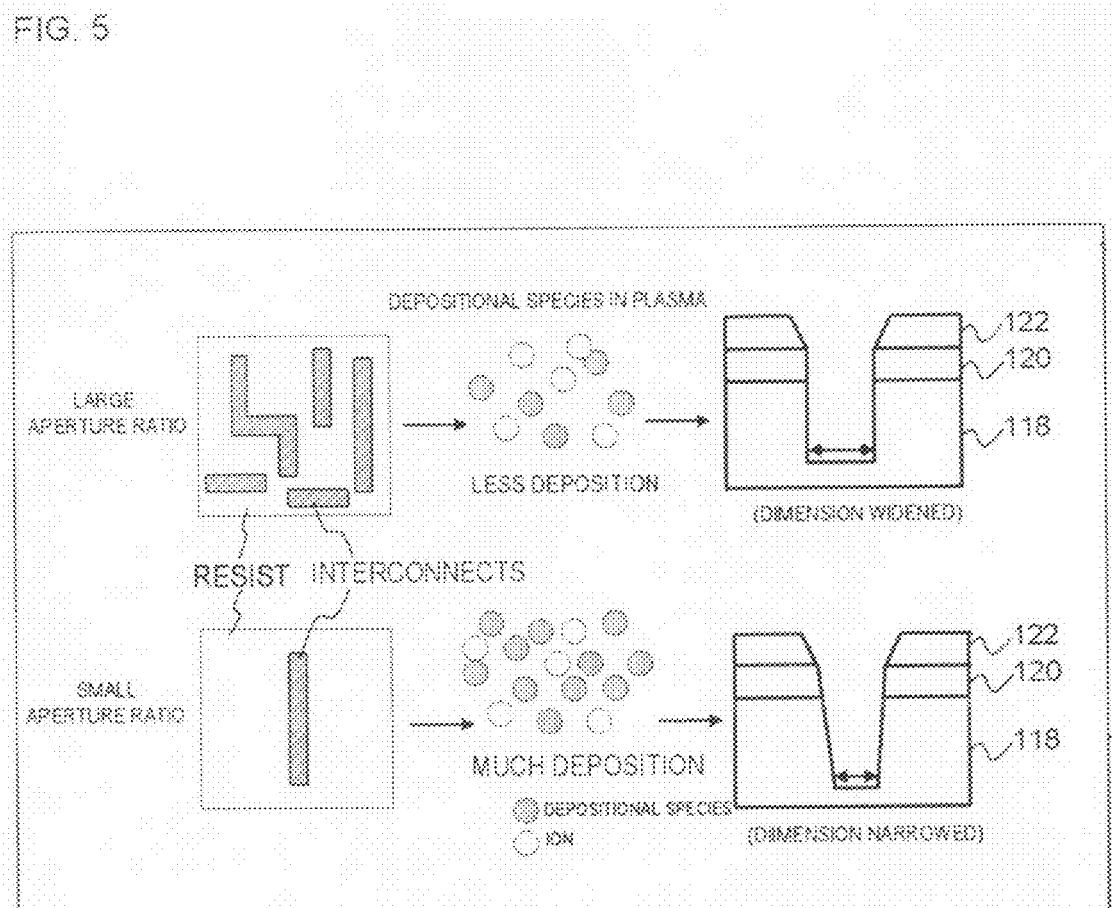
FIG. 5 is a drawing showing a mechanism of fluctuation in width $L_2$ at the bottom of interconnect trenches under varied aperture ratio.

FIG. 5 is a drawing showing a mechanism of fluctuation of the bottom width $L_2$ of the interconnect trench 142 under varied aperture ratio. If the aperture ratio is large, area of the upper resist film 122 exposed to the surface decreases. Accordingly, the amount of depositional matter possibly produced during the etching by a reaction with the upper resist film 122 becomes smaller, taper angle of portions to be etched (anti-reflective film 120 and the intermediate insulating film 118) becomes smaller, and the dimension of the trench at the bottom thereof consequently increases. Because this dimension is reflected to the lower layers, also the bottom width $L_2$ of the interconnect trench 142 is supposed to become larger. On the other hand, if the aperture ratio is small, the amount of depositional matter generated during the etching increases, the taper angle of portions to be etched becomes larger, and the dimension of the trench at the bottom thereof becomes smaller. Because this dimension is reflected to the lower layers, also the bottom width $L_2$ of the interconnect trench 142 is supposed to become smaller. It is supposed that this sort of fluctuation is likely to occur in the intermediate insulating film 118, when the etching proceeds under conditions with small ionicity, through the upper resist film 122 used as a mask.

From the results explained referring to FIG. 4 and FIG. 5, it is supposed that the bottom width $L_2$ of the interconnect trench 142 may be made uniform in the individual layers irrespective of the aperture ratio, by etching the anti-reflective film 120 so as to narrow the bottom width $L_2$ of the interconnect trench 142 when the aperture ratio is large, and by etching the anti-reflective film 120 so as to widen the bottom width $L_2$ of the interconnect trench 142 when the aperture ratio is small.

Figure 6:
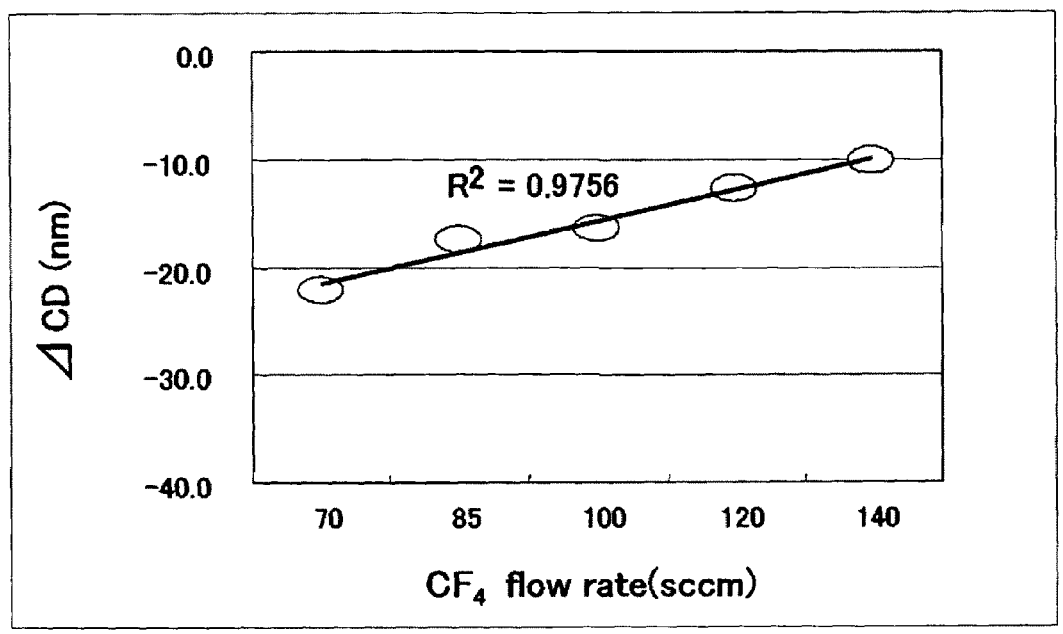
FIG. 6 is a drawing showing dimensional shift $\Delta CD$ ($L_2-L_1$) at the bottom of trenches under varied flow rate of an etching gas (unmixed $CF_4$ gas) in the process of etching an anti-reflective film.

FIG. 6 is a drawing showing dimensional shift $\Delta CD$ ($L_2-L_1$) at the bottom under varied flow rate of an etching gas (unmixed $CF_4$ gas) in the process of etching the anti-reflective film 120. The abscissa represents flow rate (sccm) of the etching gas (unmixed $CF_4$ gas) in the process of etching the anti-reflective film 120, and the ordinate represents the dimensional shift $\Delta CD$ ($L_2-L_1$) at the bottom. In the etching of the anti-reflective film 120 herein, the flow rate of $CF_4$ gas was varied under fixed conditions of a temperature of wafer stage of 20° C., a chamber pressure of 80 mTorr, a top power of 500 W, and a bias power of 450 W. As shown in FIG. 6, the dimensional shift $\Delta CD$ ($L_2-L_1$) at the bottom shifts to the plus side as the flow rate of $CF_4$ gas increases. Since the bottom width $L_1$ of the opening 130 is kept nearly constant, it is understood that the bottom width $L_2$ of the interconnect trench 142 increases as the flow rate of $CF_4$ gas increases.

From the results explained referring to FIG. 4 and FIG. 6, it is supposed that the bottom width $L_2$ of the interconnect trench 142 may be made uniform in the individual layers irrespective of the aperture ratio, by reducing the flow rate of $CF_4$ gas so as to narrow the bottom width $L_2$ of the interconnect trench 142 when the aperture ratio is large, and by increasing the flow rate of $CF_4$ gas so as to widen the bottom width $L_2$ of the interconnect trench 142 when the aperture ratio is small.

Figure 7:
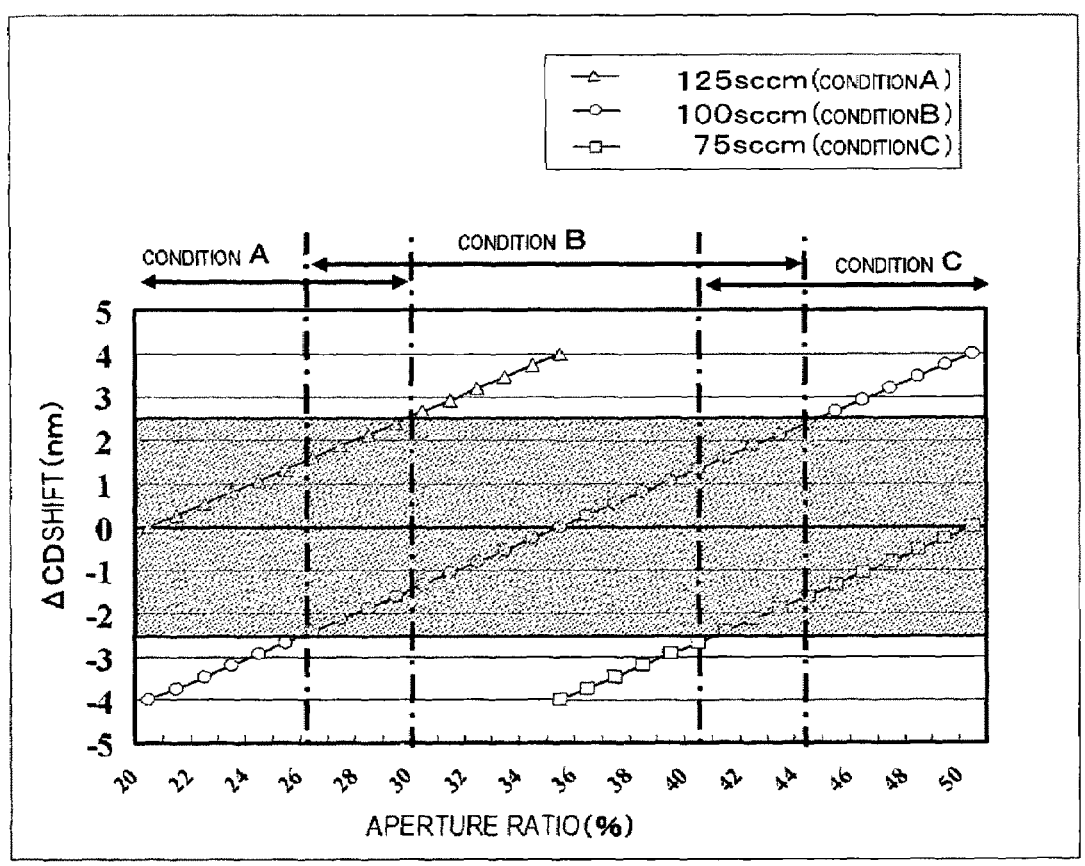
FIG. 7 is a drawing showing relations between the aperture ratio and the dimensional shift $\Delta CD$ at the bottom of interconnect trenches.

FIG. 7 is a drawing showing relations between the aperture ratio and the dimensional shift $\Delta CD$ at the bottom of interconnect trenches 142. Here is an exemplary case where the flow rate of $CF_4$ gas was adjusted to 125 sccm (condition A), 100 sccm (condition B), and 75 sccm (condition C). The ordinate represents deviation (nm) of the dimensional shift $\Delta CD$ ($L_2-L_1$) at the individual bottoms from a reference value (zero, center) defined by the dimensional shift $\Delta CD$ ($L_2-L_1$) at the bottom obtained when the $CF_4$ flow rate was adjusted to 100 sccm and the aperture ratio was adjusted to 35%. As shown in the drawing, the dimensional shift $\Delta CD$ ($L_2-L_1$) at the bottom, that is, the bottom width $L_2$ of the interconnect trench 142, increases as the aperture ratio increases.

Allowable range of $\Delta CD$ shift may be calculated based on allowable level of interconnect resistivity in the final product. FIG. 7 shows an exemplary case where the allowable range of $\Delta CD$ deviation from the reference value is ±2.5 nm. In the drawing, the hatched area represents the allowable range. By selecting conditions allowing the $\Delta CD$ deviation to fall within the allowable range depending on the aperture ratio, the bottom width $L_2$ of the interconnect trench 142 may be made uniform in the individual layers irrespective of the aperture ratio.

For an exemplary case where the aperture ratio is approximately 20 to 30%, the bottom width $L_2$ of the interconnect trench 142 may be fallen in the allowable range by etching the anti-reflective film 120 under condition A. Similarly, the bottom width $L_2$ of the interconnect trench 142 may be fallen in the allowable range by etching the anti-reflective film 120 under condition B for an aperture ratio of approximately 26 to 44%, and under condition C for an aperture ratio of approximately 40 to 51%. Whichever conditions A and B may be adoptable when the aperture ratio is approximately 26 to 30%, and whichever conditions B and C may be adoptable when the aperture ratio is approximately 40 to 44%. For example, if the aperture ratio is 28%, the bottom width $L_2$ of the interconnect trench 142 may be fallen in the allowable range, by adjusting the $CF_4$ flow rate whichever to 125 sccm (condition A) and 100 sccm (condition B).

FIGS. 8A to 8C are drawings showing the dimensional shift $\Delta CD$ ($L_2-L_1$) at the bottom and dimension, obtained under varied flow rate of $CF_4$ gas depending on the aperture ratio, in the process of etching the anti-reflective film 120. The dual damascene trench 140 was formed as explained referring to FIG. 1A to FIG. 3C, corresponding to the aperture ratios of interconnect pattern of 20%, 27%, 35%, 43% and 50%, the flow rate of $CF_4$ gas were set to 125 sccm, 113 sccm, 100 sccm, 87 sccm and 75 sccm, respectively, as shown in FIG. 8A. FIG. 8B shows the dimensional shift $\Delta CD$ ($L_2-L_1$) at the bottom under the individual aperture ratios. FIG. 8C shows dimension of the bottom of the interconnect trench 142 (bottom width $L_2$) (3σ (deviation after measurement of dimension) under the individual aperture ratio. As shown in the drawing, the dimensional shift $\Delta CD$ ($L_2-L_1$) at the bottom was regulated to nearly constant, irrespective of the aperture ratio. Also shift of the bottom width $L_2$ of the interconnect trench 142 may be suppressed within a range of 5 nm.

As described in the above, it was proven that the bottom width $L_2$ of the interconnect trench 142 may be controlled by controlling the etching conditions of the anti-reflective film 120.

The description in the above showed the exemplary case where the conditions for etching the anti-reflective film 120 were such as using an unmixed $CF_4$ gas as an etching gas, and as varying the flow rate of $CF_4$ gas depending on the aperture ratio, whereas any other conditions may be varied so far as they are correlative to the dimensional shift $\Delta CD$ ($L_2-L_1$). Examples of such etching conditions include temperature of the semiconductor substrate (wafer stage), pressure in the etching chamber in which the etching proceeds, and bias power. For another exemplary case where any gases other than $CF_4$ gas are used as the etching gas for the anti-reflective film 120, flow rate of these gases may be varied depending on the aperture ratio. Specific examples will be explained below.

Figure 9:
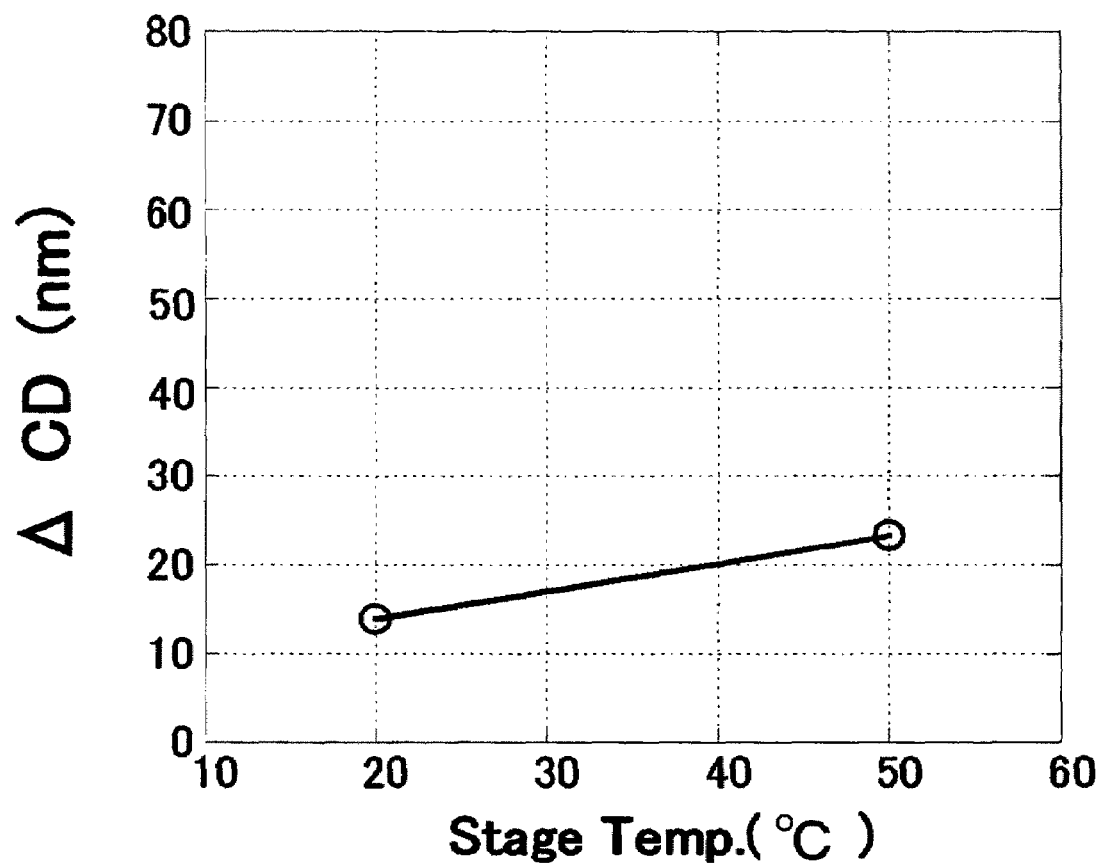
FIG. 9 is a drawing showing a relation between temperature (° C.) of a stage on which a semiconductor substrate is placed and the dimensional shift $\Delta CD$ ($L_2-L_1$) at the bottom, observed when the anti-reflective film was etched while varying the temperature of the stage.

FIG. 9 is a drawing showing a relation between temperature (° C.) of a stage on which a semiconductor substrate (wafer) is placed and the dimensional shift $\Delta CD$ ($L_2-L_1$) at the bottom, observed when the anti-reflective film 120 was etched while varying the temperature of the wafer stage. Other conditions adopted herein were a chamber pressure of 150 mTorr, a top power of 500 W, and a bias power of 500 W, all being fixed. The etching gas used herein was an unmixed $CF_4$ gas, fed at a fixed flow rate of 400 sccm. It may be understood from FIG. 9 that the dimensional shift $\Delta CD$ ($L_2-L_1$) at the bottom, that is, the bottom width $L_2$ of the interconnect trench 142 increases as the temperature of the stage, on which the semiconductor substrate is placed, is elevated. From the results, it is supposed that the bottom width $L_2$ of the interconnect trench 142 may be made uniform in the individual layers irrespective of the aperture ratio, by lowering the temperature of the stage on which the semiconductor substrate is placed, so as to narrow the bottom width $L_2$ of the interconnect trench 142 when the aperture ratio is large, and by elevating the temperature of the stage on which the semiconductor substrate is placed, so as to widen the bottom width $L_2$ of the interconnect trench 142 when the aperture ratio is small.

Figure 10:
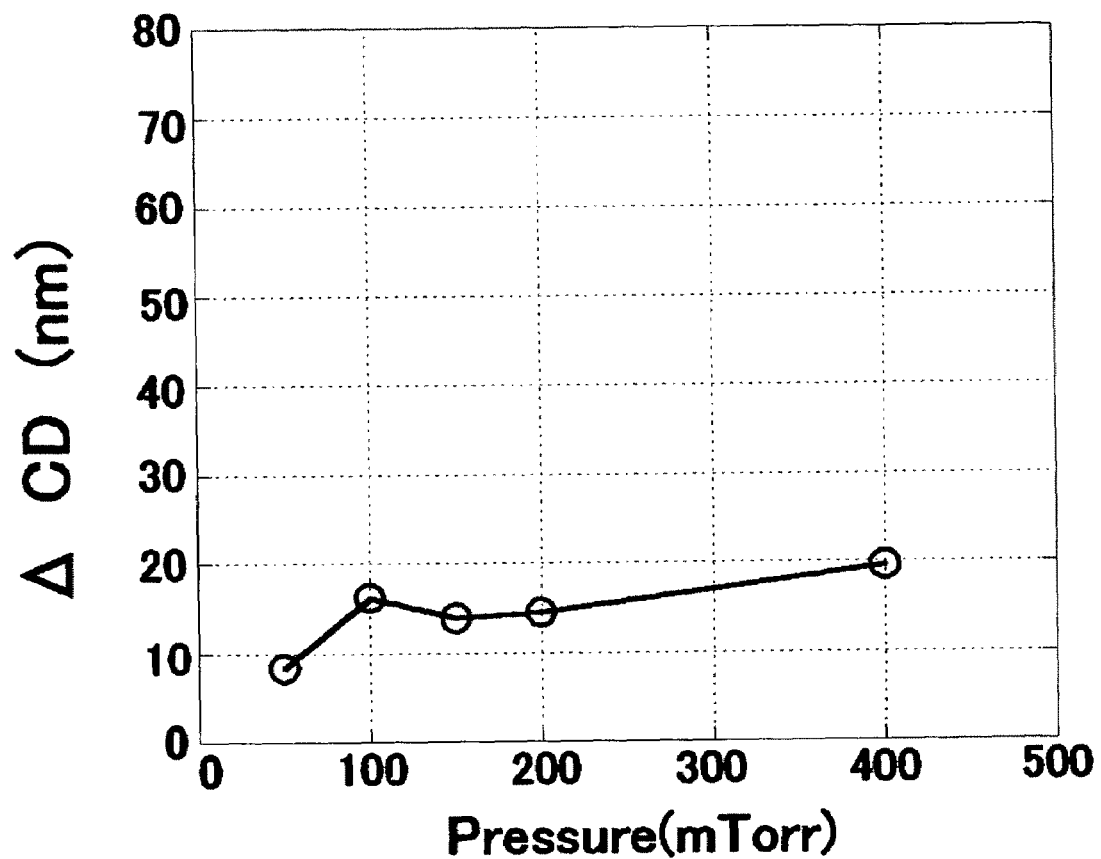
FIG. 10 is a drawing showing a relation between pressure of a chamber in which the etching proceeds and the dimensional shift $\Delta CD$ ($L_2-L_1$) at the bottom, observed when the anti-reflective film was etched while varying the pressure in the chamber.

FIG. 10 is a drawing showing a relation between pressure in the chamber in which the etching proceeds and the dimensional shift $\Delta CD$ ($L_2-L_1$) at the bottom, observed when the anti-reflective film 120 was etched while varying the pressure in the chamber in which the etching proceeds. Other conditions adopted herein were a temperature of the stage on which the wafer is placed of 20° C., a top power of 500 W, and a bias power of 500 W, all being fixed. The etching gas used herein was an unmixed $CF_4$ gas, fed at a fixed flow rate of 400 sccm. It may be understood from FIG. 10 that the dimensional shift $\Delta CD$ ($L_2-L_1$) at the bottom, that is, the bottom width $L_2$ of the interconnect trench 142 increases as the pressure in the chamber, in which the etching proceeds, is elevated. From the results, it is supposed that the bottom width $L_2$ of the interconnect trench 142 may be made uniform in the individual layers irrespective of the aperture ratio, by lowering the pressure in the chamber in which the etching proceeds so as to narrow the bottom width $L_2$ of the interconnect trench 142 when the aperture ratio is large, and by elevating the pressure in the chamber in which the etching proceeds so as to widen the bottom width $L_2$ of the interconnect trench 142 when the aperture ratio is small.

Figure 11:
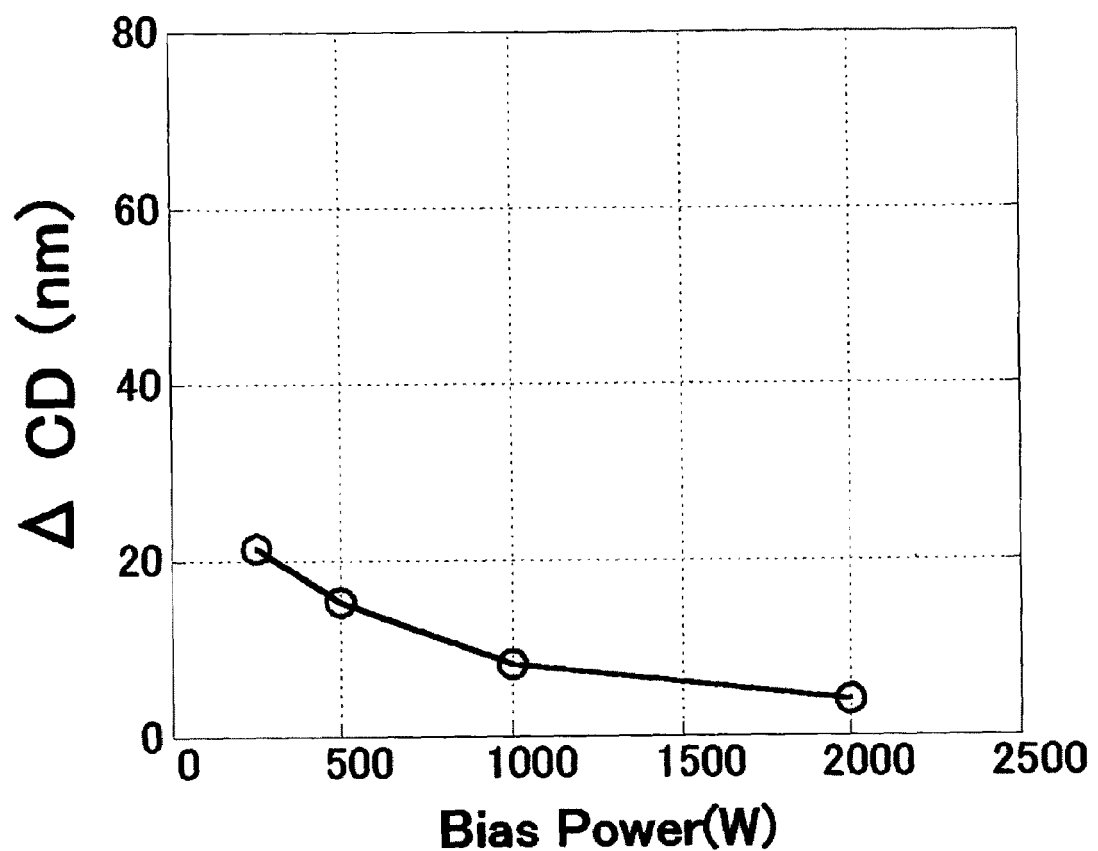
FIG. 11 is a drawing showing a relation between bias power and the dimensional shift $\Delta CD$ ($L_2-L_1$) at the bottom, observed when the anti-reflective film was etched while varying the bias power.

FIG. 11 is a drawing showing a relation between bias power and the dimensional shift $\Delta CD$ ($L_2-L_1$) at the bottom, observed when the anti-reflective film 120 was etched while varying the bias power. Other conditions adopted herein were a temperature of the stage on which the wafer is placed of 20° C., a chamber pressure of 150 mTorr, and a top power of 500 W, all being fixed. The etching gas used herein was an unmixed $CF_4$ gas, fed at a fixed flow rate of 400 sccm. It may be understood from FIG. 11 that the dimensional shift $\Delta CD$ ($L_2$-$L_1$) at the bottom, that is, the bottom width $L_2$ of the interconnect trench 142 increases as the bias power is lowered. From the results, it is supposed that the bottom width $L_2$ of the interconnect trench 142 may be made uniform in the individual layers irrespective of the aperture ratio, by elevating the bias power so as to narrow the bottom width $L_2$ of the interconnect trench 142 when the aperture ratio is large, and by lowering the bias power so as to widen the bottom width $L_2$ of the interconnect trench 142 when the aperture ratio is small.

Figure 12:
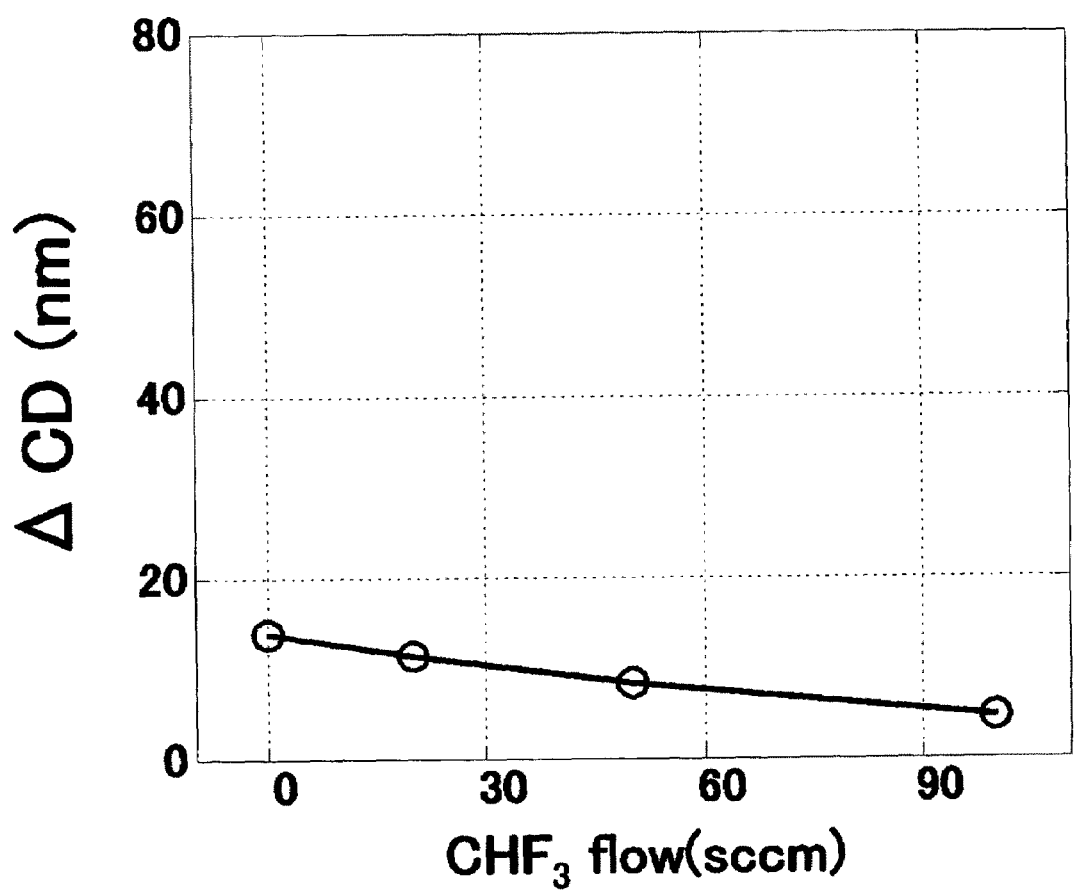
FIG. 12 is a drawing showing a relation between flow rate of $CHF_3$ gas and the dimensional shift $\Delta CD$ ($L_2-L_1$) at the bottom, observed when the anti-reflective film was etched using a mixed gas of $CF_4$ and $CHF_3$ as an etching gas, while varying the flow rate of $CHF_3$ gas.

FIG. 12 is a drawing showing a relation between flow rate of $CHF_3$ gas and the dimensional shift $\Delta CD$ ($L_2$-$L_1$) at the bottom, observed when the anti-reflective film 120 was etched using a mixed gas of $CF_4$ and $CHF_3$ as an etching gas, while varying the flow rate of $CHF_3$ gas. Other conditions adopted herein were a temperature of the stage on which the wafer is placed of 20° C., a chamber pressure of 150 mTorr, a bias power of 500 W, and a top power of 500 W, all being fixed. The flow rate of $CF_4$ gas in the etching gas was fixed to 400 sccm. It may be understood from FIG. 12 that the dimensional shift $\Delta CD$ ($L_2$-$L_1$) at the bottom, that is, the bottom width $L_2$ of the interconnect trench 142 increases as the flow rate of $CHF_3$ gas is lowered. From the results, it is supposed that the bottom width $L_2$ of the interconnect trench 142 may be made uniform in the individual layers irrespective of the aperture ratio, by elevating the flow rate of $CHF_3$ gas so as to narrow the bottom width $L_2$ of the interconnect trench 142 when the aperture ratio is large, and by lowering the flow rate of $CHF_3$ gas so as to widen the bottom width $L_2$ of the interconnect trench 142 when the aperture ratio is small.

Figure 13:
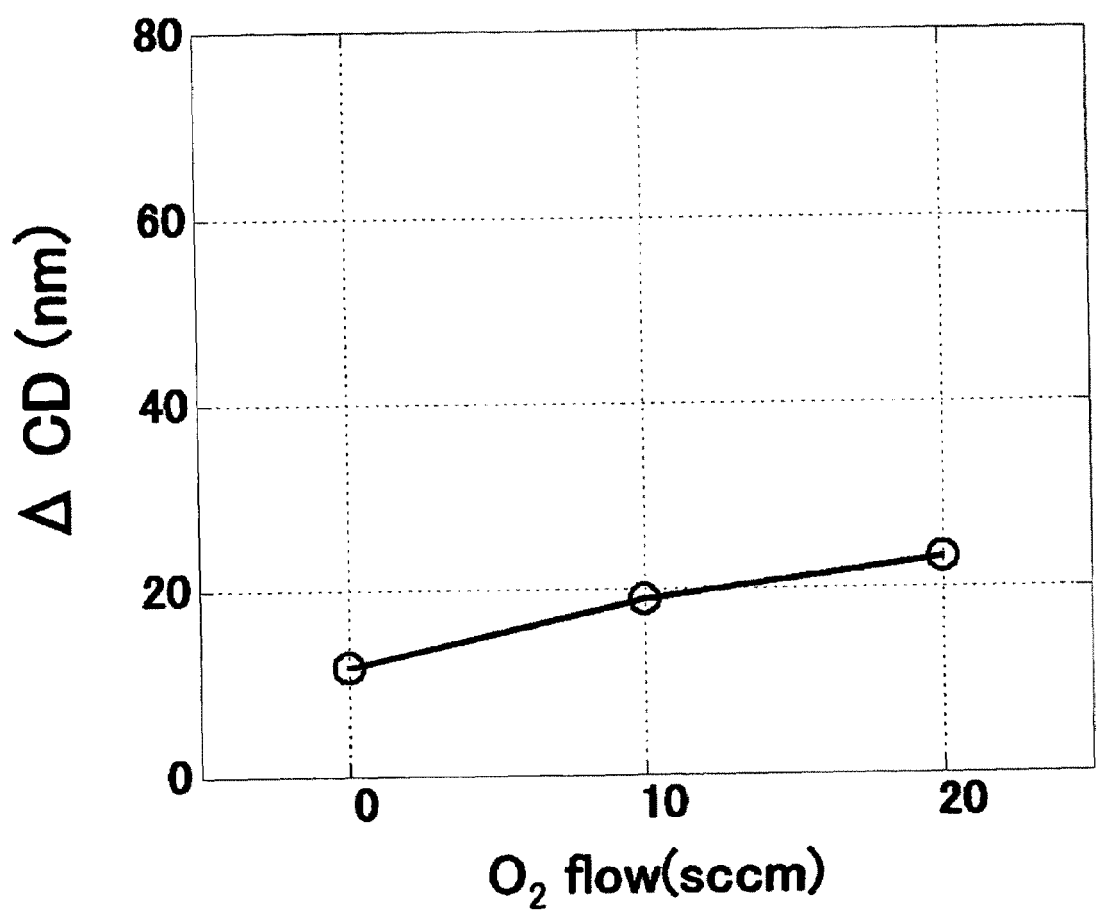
FIG. 13 is a drawing showing a relation between flow rate of $O_2$ gas and the dimensional shift $\Delta CD$ ($L_2-L_1$) at the bottom, observed when the anti-reflective film was etched using a mixed gas of $CF_4$ and $O_2$ as an etching gas, while varying the flow rate of $O_2$ gas.

FIG. 13 is a drawing showing a relation between flow rate of $O_2$ gas and the dimensional shift $\Delta CD$ ($L_2$-$L_1$) at the bottom, observed when the anti-reflective film 120 was etched using a mixed gas of $CF_4$ and $O_2$ as an etching gas, while varying the flow rate of $O_2$ gas. Other conditions adopted herein were a temperature of the stage on which the wafer is placed of 20° C., a chamber pressure of 150 mTorr, a bias power of 500 W, and a top power of 500 W, all being fixed. The flow rate of $CF_4$ gas in the etching gas was fixed to 400 sccm. It may be understood from FIG. 13 that the dimensional shift $\Delta CD$ ($L_2$-$L_1$) at the bottom, that is, the bottom width $L_2$ of the interconnect trench 142 increases as the flow rate of $O_2$ gas is elevated. From the results, it is supposed that the bottom width $L_2$ of the interconnect trench 142 may be made uniform in the individual layers irrespective of the aperture ratio, by lowering the flow rate of $O_2$ gas so as to narrow the bottom width $L_2$ of the interconnect trench 142 when the aperture ratio is large, and by elevating the flow rate of $O_2$ gas so as to widen the bottom width $L_2$ of the interconnect trench 142 when the aperture ratio is small.

As described in the above, it is supposed that the bottom width $L_2$ of the interconnect trench 142 may be made uniform in the individual layers irrespective of the aperture ratio, by acquiring correlation data between values of etching conditions correlative to the dimensional shift $\Delta CD$ ($L_2$-$L_1$) at the bottom, out of all etching conditions relevant to the anti-reflective film 120, and the dimensional shift $\Delta CD$ ($L_2$-$L_1$) at the bottom, and by varying the values of the etching conditions so as to reduce the dimensional shift $\Delta CD$ ($L_2$-$L_1$) at the bottom as the aperture ratio increases.

Figure 14:
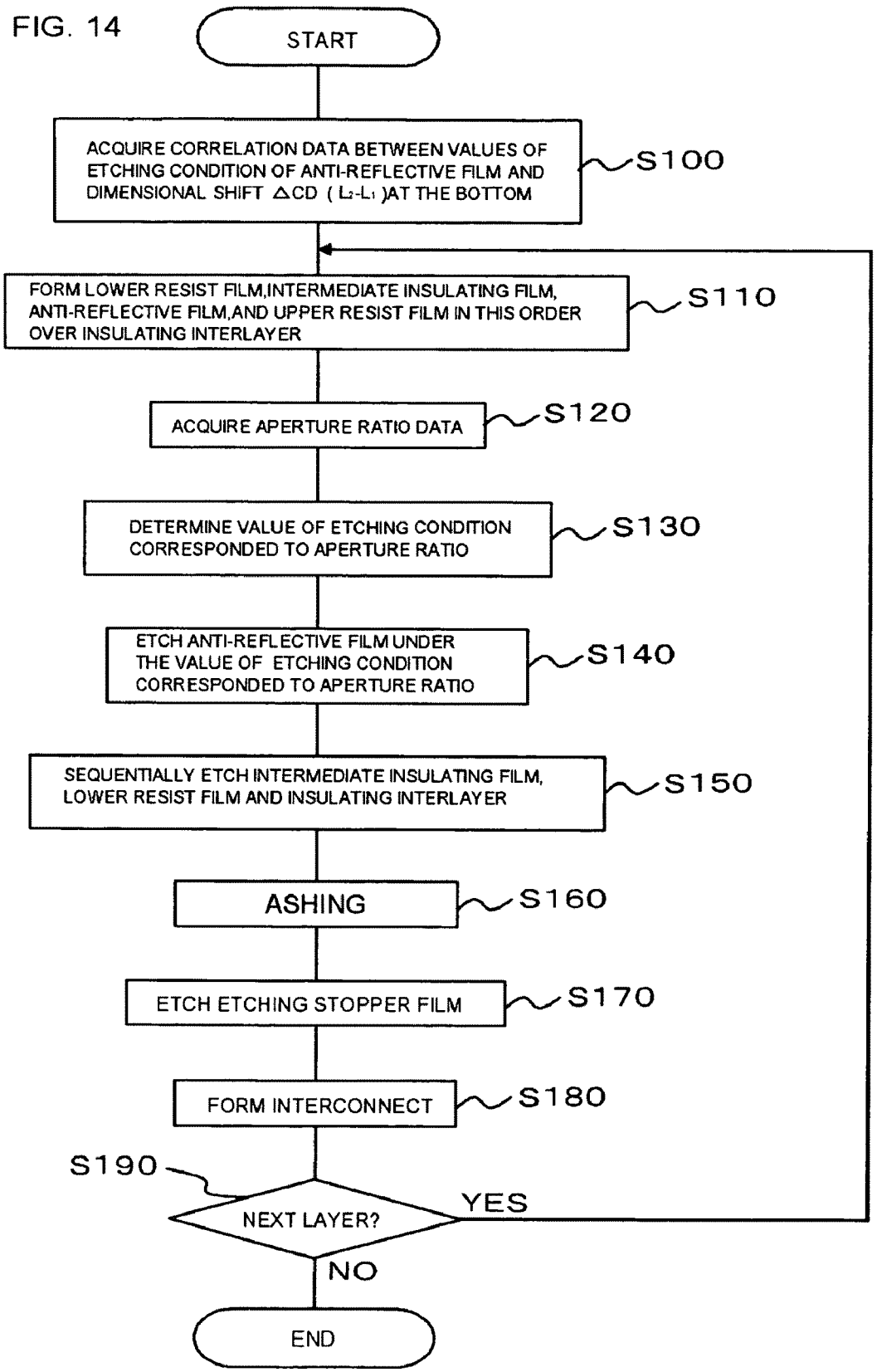
FIG. 14 is a flow chart showing procedures of manufacturing a semiconductor device in one embodiment.

FIG. 14 is a flow chart showing procedures of manufacturing a semiconductor device 100 in this embodiment.

In this embodiment, before the semiconductor device 100 is actually manufactured, correlation data between values of at least one etching condition correlative to the dimensional shift $\Delta CD$ ($L_2$-$L_1$) at the bottom, out of all etching conditions relevant to the anti-reflective film 120 explained previously referring to FIG. 1B, and the dimensional shift $\Delta CD$ ($L_2$-$L_1$) at the bottom, are preliminarily acquired (S100).

Next, the multi-layer resist film 115 having the lower resist film 116, the intermediate insulating film 118, the anti-reflective film 120, and the upper resist film 122 stacked in this order is formed over the second insulating interlayer 111 (S110). Next, aperture ratio data of recesses to be formed in the second insulating interlayer 111 to be processed is acquired (S120). Thereafter, based on the correlation data acquired in step S100 and the aperture ratio, the value of the one etching condition adapted to the anti-reflective film 120 is determined so as to reduce the dimensional shift $\Delta CD$ ($L_2$-$L_1$) at the bottom as the aperture ratio increases, depending on the aperture ratio (S130).

Next, the anti-reflective film 120 is etched based on the value of etching condition determined in step S130 (S140). The intermediate insulating film 118, the lower resist film 116, and second insulating interlayer 111 are then sequentially etched (S150). Thereafter, the residual lower resist film 116 is removed by ashing (S160). The etching stopper film 110 is then etched (S170). The dual damascene trench 140 is then filled up with an interconnect material, to thereby form the upper interconnect 132 (S180). By these processes, the interconnect for a single layer is formed. For formation of the next layer (YES in S190), the process is returned to step S110, and similarly repeated. The processes in step S120 and S130 may precede step S110. Alternatively, the values of etching conditions for the individual layers may be determined before the multi-layer structure is formed depending on the aperture ratio of the individual layers and a recipe may be created, rather than determining the value every time each of the layers is formed.

Still alternatively, a table such as shown in FIG. 15, correlating the aperture ratio with the values of etching conditions corresponded to the aperture ratio, is preliminarily created rather than acquiring the correlation data for every process, so as to enable determination of the correspondent values of etching conditions depending on the aperture ratio. An exemplary case shown herein assumes that the aperture ratio varies in the range from 20% or larger and 50% or smaller, and sets the conditions adapted to three groups of aperture ratio of 20% or above and less than 28%, 28% or above and less than 43%, and 43% or above and 50% or less. An exemplary case shown herein adopts an unmixed $CF_4$ gas as the etching gas, under varied flow rate of $CF_4$ gas.

A reticle which serves as a mask used for transferring pattern to the upper resist film 122 may be obtained in the process of manufacturing thereof, by EB conversion of data (conversion into lithographic data used for an electron beam lithographic apparatus) generated by CAD. In the process of the EB conversion, precise aperture ratio may be collected as the data. A correlation table storing names of the reticles and aperture ratios is preliminarily prepared in an independent process, an aperture ratio is fetched based on the name of reticle, the table shown in FIG. 15 is referred based on the fetched aperture ratio, and an appropriate flow rate of $CF_4$ gas may be determined. This sort of process may be done by an operator referring to the table, or may automatically be executed by the system. An exemplary system capable of executing such control will be shown below.

Figure 16:
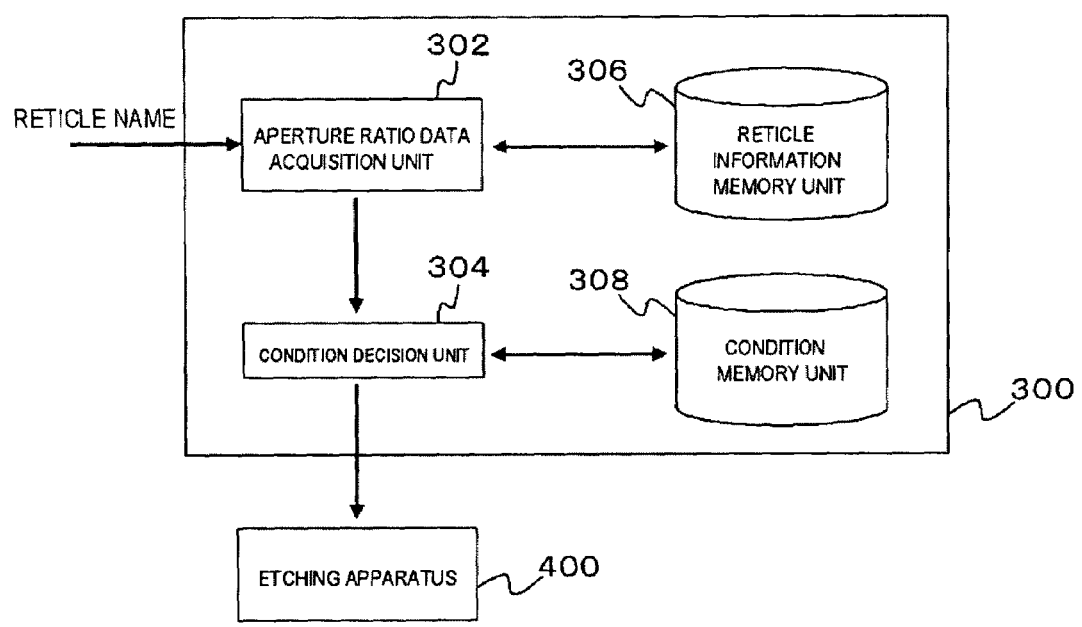
FIG. 16 is a drawing showing a configuration of an etching condition control system in one embodiment.

FIG. 16 is a drawing showing a configuration of an etching condition control system 300 of this embodiment. The etching condition control system 300 has an aperture ratio data acquisition unit 302, a condition decision unit 304, a reticle information memory unit 306, and a condition memory unit 308. The reticle information memory unit 306 contains a correlation table storing reticle names and correspondent aperture ratios. The condition memory unit 308 contains a table storing the aperture ratios such as shown in FIG. 15 as being correlated with the etching conditions corresponded to the aperture ratios. The aperture ratio data acquisition unit 302 accepts input of a reticle name, and acquires an aperture ratio data based on the reticle name, referring to the reticle information memory unit 306. The condition decision unit 304 selects an etching condition, based on the aperture ratio data acquired by the aperture ratio data acquisition unit 302, referring to the condition memory unit 308. The condition decision unit 304 controls the etching apparatus 400, so that the anti-reflective film 120 is etched under thus-selected etching condition.

The individual constituents of the etching condition control system 300 shown in FIG. 16 are expressed as blocks on the functional basis, not as configurations on the hardware basis. The individual constituents of the etching condition control system 300 may be realized by arbitrary combinations of hardware and software, mainly involving a CPU of an arbitrary computer, a memory, a program loaded to the memory, realizing the constituents shown in this drawing, a storage unit such as hard disk storing the program, and an interface for connection to a data network. Those skilled in the art may readily understand that various modifications are allowable for methods and apparatuses realizing these configurations.

COMPARATIVE EXAMPLE

Figure 19:
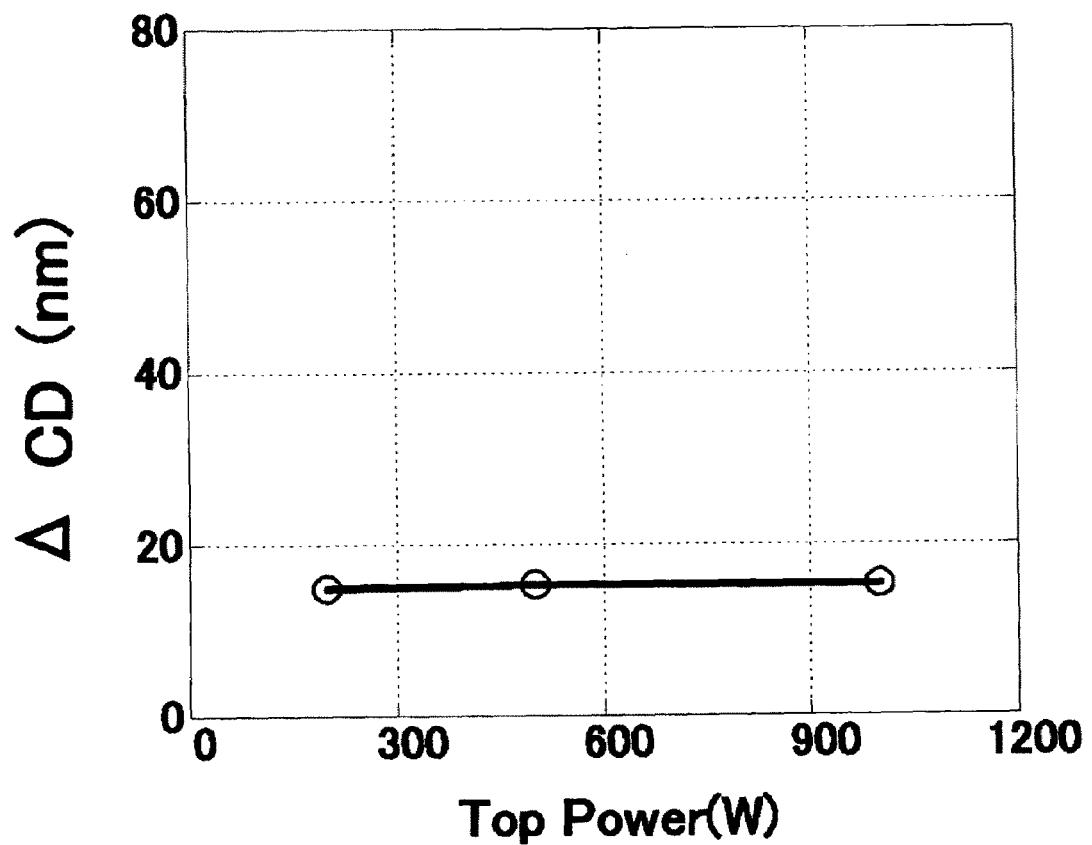
FIG. 19 is a drawing showing a relation between top power and the dimensional shift $\Delta CD$ ($L_2-L_1$), observed when the anti-reflective film was etched while varying the top power.

FIG. 19 is a drawing showing a relation between applied RF power (top power) and the dimensional shift $\Delta CD$ ($L_2-L_1$) at the bottom, observed when the anti-reflective film 120 was etched while varying the top power. Other conditions adopted herein were a temperature of the stage on which the wafer is placed of 20° C., a chamber pressure of 150 mTorr, and a bias power of 500 W, all being fixed. The etching gas used herein was an unmixed $CF_4$ gas, fed at a fixed flow rate of 400 sccm. It may be understood from FIG. 19 that the dimensional shift $\Delta CD$ ($L_2-L_1$) at the bottom, that is, the bottom width $L_2$ of the interconnect trench 142 does not changes even if the top power is varied.

Supposed reasons for the bottom width $L_2$ of the interconnect trench 142 remained unchanged may typically be such that:

(i) dimension of opening in the anti-reflective film 120 does not intrinsically change under these conditions; or that (ii) dimension of opening in the anti-reflective film 120 should certainly vary, but the dimension of opening in the lower intermediate insulating film 118 was not affected simply by the change only in the dimension of the opening in the anti-reflective film 120.

According to the present inventors' inference, not only fluctuation in the dimension of opening in the anti-reflective film 120, but also fluctuation in the dimension of bottom portion of the resist film thereabove may affect control of dimension of the opening in the intermediate insulating film 118 under the anti-reflective film 120. In this embodiment, by appropriately setting the values of etching conditions adopted when the intermediate insulating film 118 is etched, the dimension of opening in the intermediate insulating film 118 may vary, and also the dimension at the bottom of the opening 130 in the upper resist film 122 may be widened or narrowed due to deposition occurring in this process, and these are supposed to affect the dimension of opening in the intermediate insulating film 118 thereunder, in a synergistic manner. Taking such phenomena into consideration, it is understood that it may be important to control the values of etching conditions correlative to the dimensional shift considering the width $L_2$ or the recess formed in the insulating film to be incorporated into the final product, rather than to control the values of etching conditions considering fluctuation in the dimension of opening in the anti-reflective film.

The embodiments of the present invention have been described referring to the attached drawings, only as examples of the present invention, allowing adoption of any other various configurations.

In the embodiments in the above, exemplary cases of forming the dual damascene trench 140 in the second insulating interlayer 111 to be processed, using the multi-layer resist film 115 are described. The present invention may, however, be adoptable also for the case where a single-layer resist film is used. The process will be explained referring to FIG. 17A to FIG. 18C. The explanation below will be made only on aspects different from those in the explanation made referring to FIG. 1A to FIG. 3C, wherein explanation will not be repeated for the overlapped aspects.

Figure 17A:
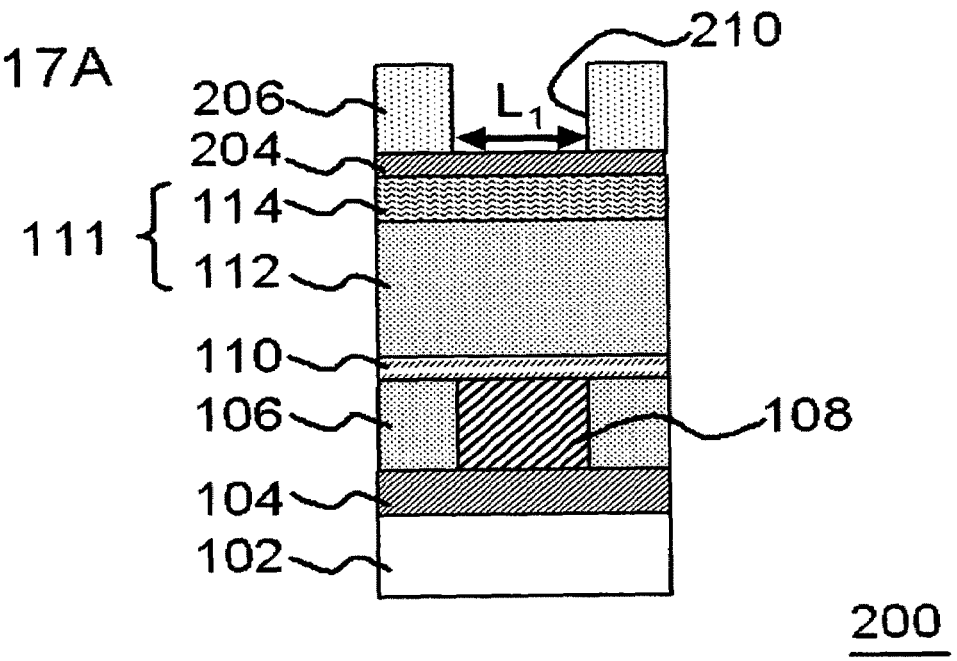
FIGS. 17A to 18C are sectional vies showing procedures of manufacturing a semiconductor device in another embodiment of the present invention.
Figure 17B:
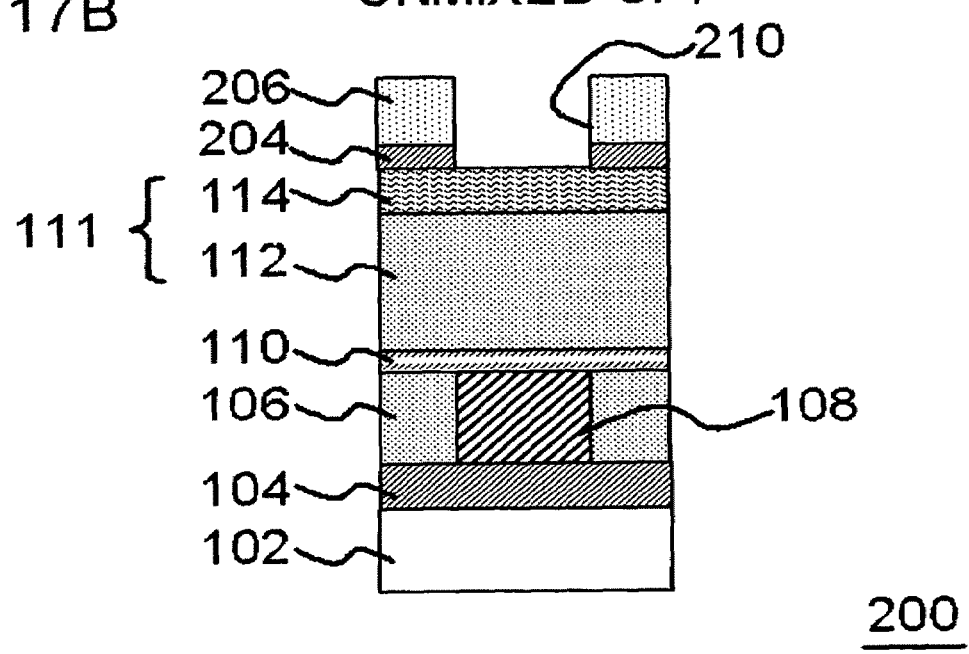

A resist film used for forming the interconnect trench is formed over a multi-layer structure having the insulating film 104, the first insulating interlayer 106, the etching stopper film 110, and the second insulating interlayer 111 stacked in this order over the semiconductor substrate 102. In this process, an anti-reflective film 204 and a resist film 206 are formed over the multi-layer structure. The resist film 206 may be a resist film used for lithography using ArF excimer laser as a light source, similarly to the upper resist film 122. After the resist film 206 is formed over the anti-reflective film 204, the resist film 206 is exposed by ArF excimer laser through a photomask, and thereby an opening 210, through which the interconnect trench is formed, is formed in the resist film 206. FIG. 17A is a drawing showing this stage. The anti-reflective film 204 is then etched through the resist film 206 used as a mask (FIG. 17B). Also in this process, an unmixed $CF_4$ gas may be used as an etching gas for the anti-reflective film 204.

Figure 18A:
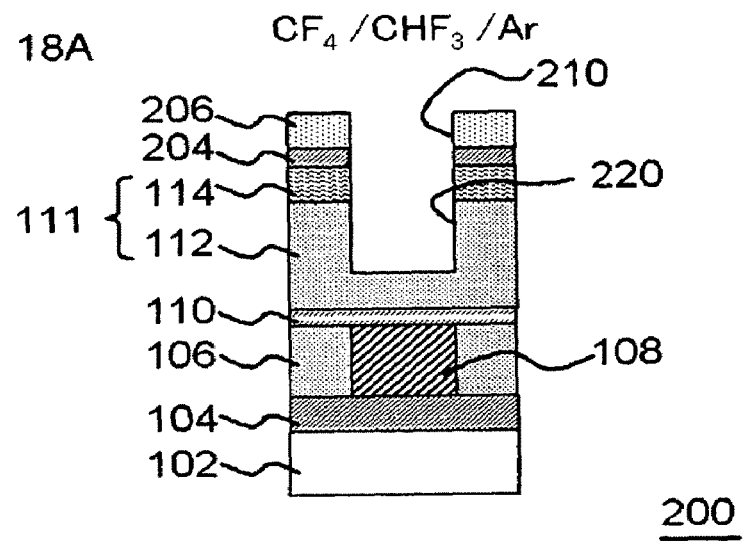
Figure 18B:
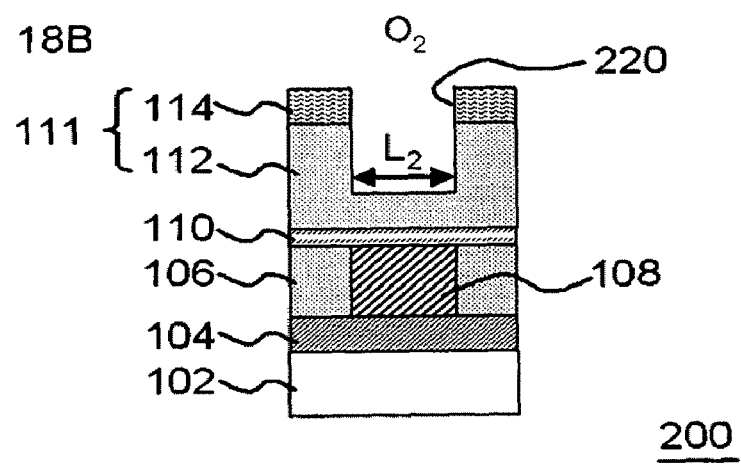
Figure 18C:
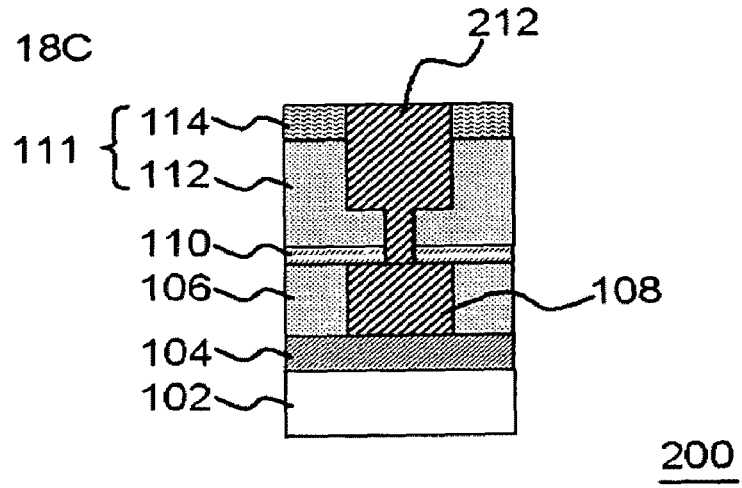

Thereafter the protective insulating film 114 and the low-k film 112 are sequentially etched through the resist film 206 and the anti-reflective film 204 used as a mask (FIG. 18A). In this process, a $CF_4/CHF_3/Ar$ mixed gas may be used as an etching gas. By this process, an interconnect trench 220 is formed in the second insulating interlayer 111. The resist film 206 and the anti-reflective film 204 are then removed by $O_2$ ashing (FIG. 18B). Thereafter, a via hole communicated with the lower interconnect 108 is formed, and the dual damascene trench composed of the via hole and the interconnect trench 220 is filled with an interconnect material, to thereby form an upper interconnect 212 (FIG. 18C). By this process, a semiconductor device 200 is formed. Also in this example, reverse correction of dimensional fluctuation possibly occurs in the protective insulating film 114 may be effected by controlling at least one etching condition of the anti-reflective film 204 depending on the aperture ratio, and thereby the dimensional fluctuation of the interconnect trench 220 formed in the second insulating interlayer 111 may be suppressed, irrespective of the aperture ratio of patterns.

Although the above description deals with the case where the dual damascene trench is formed by the dual damascene process, the present invention may be applicable also to the single damascene process. Alternatively, the present invention is applicable also to any types of dual damascene process including the via-first process by which via holes are formed first, and the trench-first process by which trenches are formed first.

Although the above description dealt with the case where the anti-reflective film was etched while varying a value of one etching condition correlative to the dimensional shift $\Delta(L_2-L_1)$, out of all etching conditions relevant to the etching of the anti-reflective film, depending on the aperture ratio of the opening formed in the upper resist film, so as to reduce the dimensional shift $\Delta(L_2-L_1)$ as the aperture ratio increases, the anti-reflective film may alternatively be etched while varying values of a plurality of etching conditions respectively correlative to the dimensional shift $\Delta(L_2-L_1)$, respectively so as to reduce the dimensional shift $\Delta(L_2-L_1)$ as the aperture ratio increases, depending on the aperture ratio.

It is apparent that the present invention is not limited to the above embodiment, that may be modified and changed without departing from the scope and spirit of the invention.

What is claimed is:

1. A method of manufacturing a semiconductor device comprising:

forming a recess, which serves as an interconnect trench or a via hole, in an insulating film to be processed formed over a semiconductor substrate by stacking an anti-reflective film and an upper resist film in this order over said insulating film to be processed, and forming an opening in said upper resist film by lithographic exposure through a mask having a predetermined pattern and development, etching said anti-reflective film through said upper resist film used as a mask, using a first etching gas containing a fluorine-base gas, and transferring a pattern formed in said anti-reflective film to said insulating film to be processed; and repeating said forming the recess to a plurality of said insulating films, so as to form recesses of different patterns respectively to said plurality of said insulating films, to thereby form a multi-layer structure;

wherein in said etching said anti-reflective film in each of said forming the recess, a value of one etching condition correlative to a dimensional shift $\Delta(L_2-L_1)$, where $L_1$ is a width of said opening in said upper resist film obtained in said forming the opening in said upper resist film and $L_2$ is a width of a recess formed in said insulating film in said transferring the pattern, is varied with respect to the aperture ratio of an opening formed in said upper resist film so as to reduce said dimensional shift $\Delta(L_2-L_1)$ as said aperture ratio of said opening increases.

2. The method of manufacturing a semiconductor device as claimed in claim 1, wherein said one etching condition correlative to said dimensional shift $\Delta(L_2-L_1)$ in said etching said anti-reflective film is a flow rate of a constituent gas contained in said first etching gas, a temperature of a stage on which said semiconductor substrate is placed, a pressure in a chamber in which the etching proceeds, or a bias power.

3. The method of manufacturing a semiconductor device as claimed in claim 1, wherein said first etching gas contains $CF_4$; and said one etching condition correlative to said dimensional shift $\Delta(L_2-L_1)$ in said etching said anti-reflective film is a flow rate of $CF_4$, so that said anti-reflective film is etched while reducing the flow rate of $CF_4$ as the aperture ratio of said opening formed in said upper resist film increases.

4. The method of manufacturing a semiconductor device as claimed in claim 3, wherein said first etching gas is a unmixed $CF_4$ gas.

5. The method of manufacturing a semiconductor device as claimed in claim 1, wherein, in said forming the opening in said upper resist film, before stacking said anti-reflective film and said upper resist film over said insulating film, a lower resist film and an intermediate insulating film are stacked in this order over said insulating film, and said anti-reflective film and said upper resist film are stacked over said intermediate insulating film, and said transferring the pattern formed in said anti-reflective film to said insulating film to be processed further comprises:

etching said intermediate insulating film through said upper resist film and said anti-reflective film used as a mask;

etching said lower resist film through said intermediate insulating film used as a mask; and etching said insulating film to be processed through said lower resist film used as a mask.

6. The method of manufacturing a semiconductor device as claimed in claim 5, wherein, in said etching said intermediate insulating film, said intermediate insulating film is etched under a condition lowered in the ionicity from that of a condition under which said insulating film to be processed is etched.

7. The method of manufacturing a semiconductor device as claimed in claim 5, wherein, in said etching said anti-reflective film, said anti-reflective film is etched under a condition lowered in the ionicity from that of a condition under which said insulating film to be processed is etched.

8. The method of manufacturing a semiconductor device as claimed in claim 5, wherein said intermediate insulating film is a $SiO_2$ film.

9. The method of manufacturing a semiconductor device as claimed in claim 1, wherein said upper resist film is a resist film used in lithography using ArF excimer laser as a light source; and in said forming an opening in said upper resist film, said opening is formed in said upper resist film by lithography using ArF excimer laser as a light source.

10. The method of manufacturing a semiconductor device as claimed in claim 1, wherein a correlation data of values of said one etching condition and said dimensional shift $\Delta(L_2-L_1)$ is preliminarily acquired, by forming said recess of the same pattern in each of a plurality of insulating films to be processed under a plurality of conditions varied in the value of said one etching condition in said forming the recess, and in said etching said anti-reflective film in each of said forming the recess, the value of said one etching condition is varied based on said aperture ratio and said correlation data so as to narrow the width of said recess in said correlation data as said aperture ratio increases.

11. The method of manufacturing a semiconductor device as claimed in claim 1, wherein a correlation table storing values of said one etching condition and said aperture ratios, as being correlated so that said dimensional shift $\Delta(L_2-L_1)$ decreases as said aperture ratio increases, is preliminarily acquired, and in said etching said anti-reflective film in each of said forming the recess, said anti-reflective film is etched while adopting a value of said etching condition correlated to said aperture ratio, based on said aperture ratio and said correlation table.

12. A control system controlling procedures of manufacturing a semiconductor device, said procedures comprising:

forming a recess, which serves as an interconnect trench or a via hole, in an insulating film to be processed formed over a semiconductor substrate by stacking an anti-reflective film and an upper resist film in this order over said insulating film to be processed, and forming an opening in said upper resist film by lithographic exposure through a mask having a predetermined pattern and development, etching said anti-reflective film through said upper resist film used as a mask, using a first etching gas containing a fluorine-base gas, and transferring a pattern formed in said anti-reflective film to said insulating film to be processed; and repeating said forming the recess to a plurality of said insulating films, so as to form recesses of different patterns respectively to said plurality of said insulating films, to thereby form a multi-layer structure;

said system comprising:

a memory unit which stores a table storing the values of one etching condition in said etching said anti-reflective film correlative to a dimensional shift $\Delta(L_2-L_1)$, where $L_1$ is a width of said opening in said upper resist film obtained in said forming the opening in said upper resist film and $L_2$ is a width of a recess formed in said insulating film in said transferring the pattern, and the aperture ratios of said opening formed in said upper resist film, as being correlated so that said dimensional shift $\Delta(L_2-L_1)$ decreases as said aperture ratio increases;

an aperture ratio data acquisition unit which acquires said aperture ratio, for each of said plurality of insulating films in said multi-layer structure; and a condition decision unit which determines the value of said one etching condition correlated to said aperture ratio, based on said aperture ratio acquired by said aperture ratio data acquisition unit, referring to said correlation table in said memory unit, for each of said plurality of insulating films in said multi-layer structure.

\* \* \* \* \*